(12) United States Patent
Jia et al.

(10) Patent No.: US 12,731,643 B2
(45) Date of Patent: Sep. 8, 2026

(54) METHOD AND SYSTEM FOR ADJUSTABLE TOP SELECT GATE CONTROL

(71) Applicant: Yangtze Memory Technologies Co., Ltd., Wuhan (CN)

(72) Inventors: Jianquan Jia, Wuhan (CN); Lei Liu, Wuhan (CN); Lei Jin, Wuhan (CN); Zhiliang Xia, Wuhan (CN); Zongliang Huo, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 364 days.

(21) Appl. No.: 18/124,946

(22) Filed: Mar. 22, 2023

(65) Prior Publication Data

US 2024/0304246 A1 Sep. 12, 2024

(30) Foreign Application Priority Data

Mar. 9, 2023 (CN) ........................ 202310225207.8

(51) Int. Cl.
*G11C 16/10* (2006.01)
*G11C 16/04* (2006.01)
(Continued)

(52) U.S. Cl.
CPC .......... *G11C 16/10* (2013.01); *G11C 16/0483* (2013.01); *H10B 41/10* (2023.02);
(Continued)

(58) Field of Classification Search
CPC ....... G11C 16/10; G11C 16/0483; G11C 5/02; G11C 5/14; G11C 7/18; G11C 8/14;
(Continued)

(56) References Cited

U.S. PATENT DOCUMENTS

2013/0094294 A1* 4/2013 Kwak .................... H10B 43/35
365/185.24
2015/0049545 A1* 2/2015 Jo ...................... G11C 16/3459
365/185.03

(Continued)

*Primary Examiner* — Mohammed A Bashar
(74) *Attorney, Agent, or Firm* — Conley Rose, P.C.

(57) ABSTRACT

A three-dimensional (3D) memory device includes a memory string, a coarse top select gate (TSG) line configured to couple a coarse threshold voltage ($V_{th\_coarse}$) for programming the memory string, a word line configured to program the memory string, a buffer TSG line configured to couple a buffer threshold voltage ($V_{th\_buffer}$) for programming the memory string, a fine TSG line configured to couple a fine threshold voltage ($V_{th\_fine}$) for programming the memory string, and a coarse TSG cut disposed between the memory string and a second memory string adjacent the memory string. The 3D memory device can intrinsically increase the coarse threshold voltage ($V_{th\_coarse}$), decrease leakage current, dynamically adjust and fine tune a threshold voltage ($V_{th}$) of the memory string, and increase TSG reliability.

20 Claims, 15 Drawing Sheets

100
102
Memory Controller
106
110
Memory Device
108
Host
104

(51) Int. Cl.
*H10B 41/10* (2023.01)
*H10B 41/27* (2023.01)
*H10B 41/35* (2023.01)
*H10B 43/10* (2023.01)
*H10B 43/27* (2023.01)
*H10B 43/35* (2023.01)

(52) U.S. Cl.
CPC ............. *H10B 41/27* (2023.02); *H10B 41/35* (2023.02); *H10B 43/10* (2023.02); *H10B 43/27* (2023.02); *H10B 43/35* (2023.02)

(58) Field of Classification Search
CPC ........ H10B 41/10; H10B 41/27; H10B 41/35; H10B 43/10; H10B 43/27; H10B 43/35
See application file for complete search history.

(56) References Cited

U.S. PATENT DOCUMENTS

2016/0314843 A1* 10/2016 Tseng .................. G11C 11/5671
2021/0335806 A1 10/2021 Wu

* cited by examiner

METHOD AND SYSTEM FOR ADJUSTABLE TOP SELECT GATE CONTROL

BACKGROUND

Field

The present disclosure relates to memory apparatuses, systems, and methods, for example, adjustable top select gate (TSG) control for fine tuning a threshold voltage ($V_{th}$) and increasing TSG reliability in a three-dimensional (3D) memory device.

Background

Flash memory (flash) is a non-volatile memory that uses charge stored on a charge storage layer to represent information. Flash stores each bit (e.g., 0 or 1) in a memory cell that includes a transistor with a charge storage layer. Memory device architectures can provide ultra-high density storage.

A top select gate (TSG) is an array connection to provide a voltage to a particular memory cell in a memory array to select which row of bits is to be read, programmed, or erased. A TSG cut (e.g., an insulating layer) cuts through a TSG layer and can be used to divide a memory page or memory finger into two equal memory pages. The TSG cut can extend laterally across a memory page and between adjacent memory strings, effectively reducing an area of each memory page without lowering the storage capacity. The TSG cut can distinguish between selected memory strings and unselected memory strings.

Current 3D memory devices utilize longer memory strings (e.g., NAND strings). Memory cells of the memory strings can be programmed from bottom to top. However, as the length of the memory strings increases, variations in manufacturing processes can cause a lateral TSG cut position to shift (e.g., vertically). The shift in TSG cut position can lead to asymmetric TSG cuts that can increase leakage current (e.g., channel is not completely isolated) and decrease TSG reliability over time.

SUMMARY

Accordingly, there is a need to provide adjustable top select gate (TSG) control to intrinsically increase a coarse threshold voltage ($V_{th\_coarse}$) and decrease leakage current through doping. Further, there is a need to dynamically adjust and fine tune a threshold voltage ($V_{th}$) of the memory string and increase TSG reliability. Further, there is a need to provide a skewed TSG cut (e.g., zig-zag) for reduced memory string critical dimensions (e.g., diameter) and improved manufacturing efficiency.

In some aspects, a three-dimensional (3D) memory device can include a memory string, a first gate contact, a second gate contact, and a coarse top select gate (TSG) cut. In some aspects, the memory string can be configured to store an electrical charge. In some aspects, the first gate contact can surround a first portion of the memory string. In some aspects, the first gate contact can be coupled to a coarse top select gate (TSG) line configured to address the memory string. In some aspects, the coarse TSG line can be configured to couple a coarse threshold voltage ($V_{th\_coarse}$) for programming the memory string. In some aspects, the second gate contact can surround a second portion of the memory string. In some aspects, the second gate contact can be coupled to a word line configured to program the memory string. In some aspects, the coarse TSG cut can extend into a portion of the memory string. In some aspects, the coarse TSG cut can be disposed between the memory string and a second memory string adjacent the memory string.

In some aspects, the first portion of the memory string can be doped. In some aspects, the first portion of the memory string can be configured to intrinsically increase the coarse threshold voltage ($V_{th\_coarse}$) and decrease leakage current of the memory string. In some aspects, the 3D memory device can further include a controller coupled to the coarse TSG line. In some aspects, the controller can be configured to provide the coarse threshold voltage ($V_{th\_coarse}$). In some aspects, the coarse threshold voltage ($V_{th\_coarse}$) can be in a range from about 2 volts (V) to about 5 V. In some aspects, the coarse threshold voltage ($V_{th\_coarse}$) can be in a range from about 0.5 V to about 7.5 V. In some aspects, the first gate contact can include a plurality of first gate contacts each coupled to the coarse TSG line.

In some aspects, the coarse TSG cut extends into a channel of the memory string and a channel of the second memory string. In some aspects, the coarse TSG cut can be symmetric. In some aspects, the coarse TSG cut can include a symmetric coarse TSG cut extending into a channel of the memory string and a channel of the second memory string. In some aspects, the coarse TSG cut extends into a channel of the memory string or a channel of the second memory string. In some aspects, the coarse TSG cut can be asymmetric. In some aspects, the coarse TSG cut can include an asymmetric coarse TSG cut extending into a channel of the memory string or a channel of the second memory string.

In some aspects, the 3D memory device can further include a third gate contact surrounding a third portion of the memory string. In some aspects, the third gate contact can be coupled to a buffer TSG line configured to address the memory string. In some aspects, the buffer TSG line can be configured to couple a buffer threshold voltage ($V_{th\_buffer}$) for programming the memory string. In some aspects, the 3D memory device can further include a controller coupled to the buffer TSG line. In some aspects, the controller can be configured to provide the buffer threshold voltage ($V_{th\_buffer}$). In some aspects, the buffer threshold voltage ($V_{th\_buffer}$) can be in a range from about 0 V to about 2 V. In some aspects, the buffer threshold voltage ($V_{th\_buffer}$) can be in a range from about 0 V to about 5 V. In some aspects, the third gate contact can include a plurality of third gate contacts each coupled to the buffer TSG line.

In some aspects, the 3D memory device can further include a fourth gate contact surrounding a fourth portion of the memory string. In some aspects, the fourth gate contact can be coupled to a fine TSG line configured to address the memory string. In some aspects, the fine TSG line can be configured to couple a fine threshold voltage ($V_{th\_fine}$) for programming the memory string. In some aspects, the 3D memory device can further include a controller coupled to the fine TSG line. In some aspects, the controller can be configured to provide the fine threshold voltage ($V_{th\_fine}$). In some aspects, the fine threshold voltage ($V_{th\_fine}$) can be in a range from about 2 V to about 2.2 V. In some aspects, the fine threshold voltage ($V_{th\_fine}$) can be in a range from about 0.5 V to about 5 V. In some aspects, the fourth gate contact can include a plurality of fourth gate contacts each coupled to the fine TSG line.

In some aspects, a three-dimensional (3D) memory device can include a memory string, a first gate contact, a second gate contact, and a coarse top select gate (TSG) cut. In some aspects, the memory string can be configured to store an electrical charge. In some aspects, the memory string can include an extended upper portion. In some aspects, the first gate contact can surround the extended upper portion of the memory string. In some aspects, the first gate contact can be coupled to a coarse top select gate (TSG) line configured to address the memory string. In some aspects, the coarse TSG line can be configured to couple a coarse threshold voltage ($V_{th\_coarse}$) for programming the memory string. In some aspects, the second gate contact can surround a second portion of the memory string. In some aspects, the second gate contact can be coupled to a word line configured to program the memory string. In some aspects, the coarse TSG cut can be disposed between the memory string and a second memory string adjacent the memory string.

In some aspects, the extended upper portion of the memory string can be doped. In some aspects, the extended upper portion of the memory string can be configured to intrinsically increase the coarse threshold voltage ($V_{th\_coarse}$) and decrease leakage current of the memory string. In some aspects, the 3D memory device can further include a controller coupled to the coarse TSG line. In some aspects, the controller can be configured to provide the coarse threshold voltage ($V_{th\_coarse}$). In some aspects, the coarse threshold voltage ($V_{th\_coarse}$) can be in a range from about 0 V to about 10 V. In some aspects, the first gate contact can include a plurality of first gate contacts each coupled to the coarse TSG line.

In some aspects, the coarse TSG cut can include a skewed TSG cut disposed between the extended upper portion of the memory string and an extended upper portion of the second memory string. In some aspects, in a plan view, the skewed TSG cut can include a zig-zag shape.

In some aspects, the 3D memory device can further include a third gate contact surrounding a third portion of the memory string. In some aspects, the third gate contact can be coupled to a buffer TSG line configured to address the memory string. In some aspects, the buffer TSG line can be configured to couple a buffer threshold voltage ($V_{th\_buffer}$) for programming the memory string. In some aspects, the 3D memory device can further include a controller coupled to the buffer TSG line. In some aspects, the controller can be configured to provide the buffer threshold voltage ($V_{th\_buffer}$). In some aspects, the buffer threshold voltage ($V_{th\_buffer}$) can be in a range from about 0 V to about 2 V. In some aspects, the buffer threshold voltage ($V_{th\_buffer}$) can be in a range from about 0 V to about 7.5 V. In some aspects, the third gate contact can include a plurality of third gate contacts each coupled to the buffer TSG line.

In some aspects, the 3D memory device can further include a fourth gate contact surrounding a fourth portion of the memory string. In some aspects, the fourth gate contact can be coupled to a fine TSG line configured to address the memory string. In some aspects, the fine TSG line can be configured to couple a fine threshold voltage ($V_{th\_fine}$) for programming the memory string. In some aspects, the 3D memory device can further include a controller coupled to the fine TSG line. In some aspects, the controller can be configured to provide the fine threshold voltage ($V_{th\_fine}$). In some aspects, the fine threshold voltage ($V_{th\_fine}$) can be in a range from about 2 V to about 2.2 V. In some aspects, the fine threshold voltage ($V_{th\_fine}$) can be in a range from about 1 V to about 3 V. In some aspects, the fourth gate contact can include a plurality of fourth gate contacts each coupled to the fine TSG line.

In some aspects, a three-dimensional (3D) memory device can include a memory string, a first gate contact, a second gate contact, a third gate contact, a fourth gate contact, and a coarse top select gate (TSG) cut. In some aspects, the memory string can be configured to store an electrical charge. In some aspects, the first gate contact can surround a first portion of the memory string. In some aspects, the first gate contact can be coupled to a coarse top select gate (TSG) line. In some aspects, the coarse TSG line can be configured to couple a coarse threshold voltage ($V_{th\_coarse}$) for programming the memory string. In some aspects, the second gate contact can surround a second portion of the memory string. In some aspects, the second gate contact can be coupled to a word line configured to program the memory string. In some aspects, the third gate contact can surround a third portion of the memory string. In some aspects, the third gate contact can be coupled to a buffer TSG line. In some aspects, the buffer TSG line can be configured to couple a buffer threshold voltage ($V_{th\_buffer}$) for programming the memory string. In some aspects, the fourth gate contact can surround a fourth portion of the memory string.

In some aspects, the fourth gate contact can be coupled to a fine TSG line. In some aspects, the fine TSG line can be configured to couple a fine threshold voltage ($V_{th\_fine}$) for programming the memory string. In some aspects, the coarse TSG cut can be disposed between the memory string and a second memory string adjacent the memory string.

In some aspects, the buffer TSG line can be arranged atop the fine TSG line and the coarse TSG line can be arranged atop the buffer TSG line.

In some aspects, the 3D memory device can further include a top contact coupled to the memory string. In some aspects, the top contact can be coupled to a bit line configured to flow electrical charge through the memory string. In some aspects, the 3D memory device can further include a bottom contact coupled to the memory string. In some aspects, the bottom contact can be coupled to a source line configured to flow electrical charge through the memory string.

In some aspects, the 3D memory device can further include a fifth gate contact surrounding a fifth portion of the memory string. In some aspects, the fifth gate contact can be coupled to a bottom select gate (BSG) line.

In some aspects, the first portion of the memory string can be doped. In some aspects, the doped first portion can be configured to intrinsically increase the coarse threshold voltage ($V_{th\_coarse}$). In some aspects, the doped first portion can be configured to decrease leakage current of the memory string.

In some aspects, the 3D memory device can further include a controller coupled to the coarse TSG line, the buffer TSG line, and the fine TSG line. In some aspects, the controller can be configured to provide the coarse threshold voltage ($V_{th\_coarse}$), the buffer threshold voltage ($V_{th\_coarse}$), and fine threshold voltage ($V_{th\_fine}$) to dynamically adjust a threshold voltage ($V_{th}$) of the memory string during a programming phase of the memory string.

In some aspects, in a select block programming phase, the coarse TSG line can have a HIGH level voltage, the buffer TSG line can have a HIGH level voltage, and the fine TSG line can have a HIGH level voltage. In some aspects, in the select block programming phase, the HIGH level voltage of the coarse TSG line can include a pre-charge $V_{pass}$ voltage.

In some aspects, in an unselect block programming phase, the coarse TSG line can have a HIGH level voltage, the buffer TSG line can have a HIGH level voltage, and the fine TSG line can have a LOW level voltage. In some aspects, in the unselect block programming phase, the HIGH level voltage of the coarse TSG line can include a floating voltage and the HIGH level voltage of the buffer TSG line can include a floating voltage.

In some aspects, the 3D memory device can include a 3D NAND device.

In some aspects, a method of programming a memory device can include applying a plurality of program pulses to a memory string of the memory device to dynamically adjust a threshold voltage ($V_{th}$) of the memory string during a programming phase. In some aspects, the memory device can include a plurality of memory strings, each memory string including a first transistor controlled by a coarse top select gate (TSG) and connected to a bit line (BL), a second transistor controlled by a buffer TSG, a third transistor controlled by a fine TSG, a bottom transistor controlled by a bottom select gate (BSG), and a plurality of memory cells between the third transistor and the bottom transistor, each memory cell connected to a word line (WL). In some aspects, applying the plurality of program pulses can include applying a first voltage pulse to a selected coarse TSG to provide a coarse threshold voltage ($V_{th\_coarse}$). In some aspects, applying the plurality of program pulses can include applying a second voltage pulse to a buffer TSG to provide a buffer threshold voltage ($V_{th\_buffer}$). In some aspects, applying the plurality of program pulses can include applying a third voltage pulse to a fine TSG to provide a fine threshold voltage ($V_{th\_fine}$).

In some aspects, during a select block programming phase, the first voltage pulse can be weighted to a HIGH level voltage of the selected coarse TSG, the second voltage pulse can be weighted to a HIGH level voltage of the buffer TSG, and the third voltage pulse can be weighted to a HIGH level voltage of the fine TSG.

In some aspects, during a select block programming phase, the first voltage pulse can be weighted to a first pass voltage $V_{PASS}$ of the selected coarse TSG, the second voltage pulse can be weighted to a first common collector voltage $V_{CC}$ of the buffer TSG, and the third voltage pulse can be weighted to a second common collector voltage $V_{CC}$ voltage of the fine TSG.

In some aspects, the first pass voltage $V_{PASS}$ can be about 0.5 V to about 5 V. In some aspects, the first common collector voltage $V_{CC}$ can be about 0.5 V to about 5 V. In some aspects, the second common collector voltage $V_{CC}$ can be about 0.5 V to about 5 V.

In some aspects, during an unselect block programming phase, the first voltage pulse can be weighted to a HIGH level voltage of the selected coarse TSG, the second voltage pulse can be weighted to a HIGH level voltage of the buffer TSG, and the third voltage pulse can be weighted to a LOW level voltage of the fine TSG.

In some aspects, during an unselect block programming phase, the first voltage pulse can be weighted to a third common collector voltage $V_{CC}$ of the selected coarse TSG, the second voltage pulse can be weighted to a fourth common collector voltage $V_{CC}$ of the buffer TSG, and the third voltage pulse can be weighted to a first source supply voltage $V_{SS}$ of the fine TSG.

In some aspects, the third common collector voltage $V_{CC}$ can be about 0.5 V to about 5 V. In some aspects, the fourth common collector voltage $V_{CC}$ can be about 0.5 V to about 5 V. In some aspects, the first source supply voltage $V_{SS}$ can be about 0 V to about 2 V.

Implementations of any of the techniques described above may include a system, a method, a process, a device, and/or an apparatus. The details of one or more implementations are set forth in the accompanying drawings and the description below. Other features will be apparent from the description and drawings, and from the claims.

Further features and exemplary aspects of the aspects, as well as the structure and operation of various aspects, are described in detail below with reference to the accompanying drawings. It is noted that the aspects are not limited to the specific aspects described herein. Such aspects are presented herein for illustrative purposes only. Additional aspects will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the aspects and, together with the description, further serve to explain the principles of the aspects and to enable a person skilled in the relevant art(s) to make and use the aspects.

Figure 1:
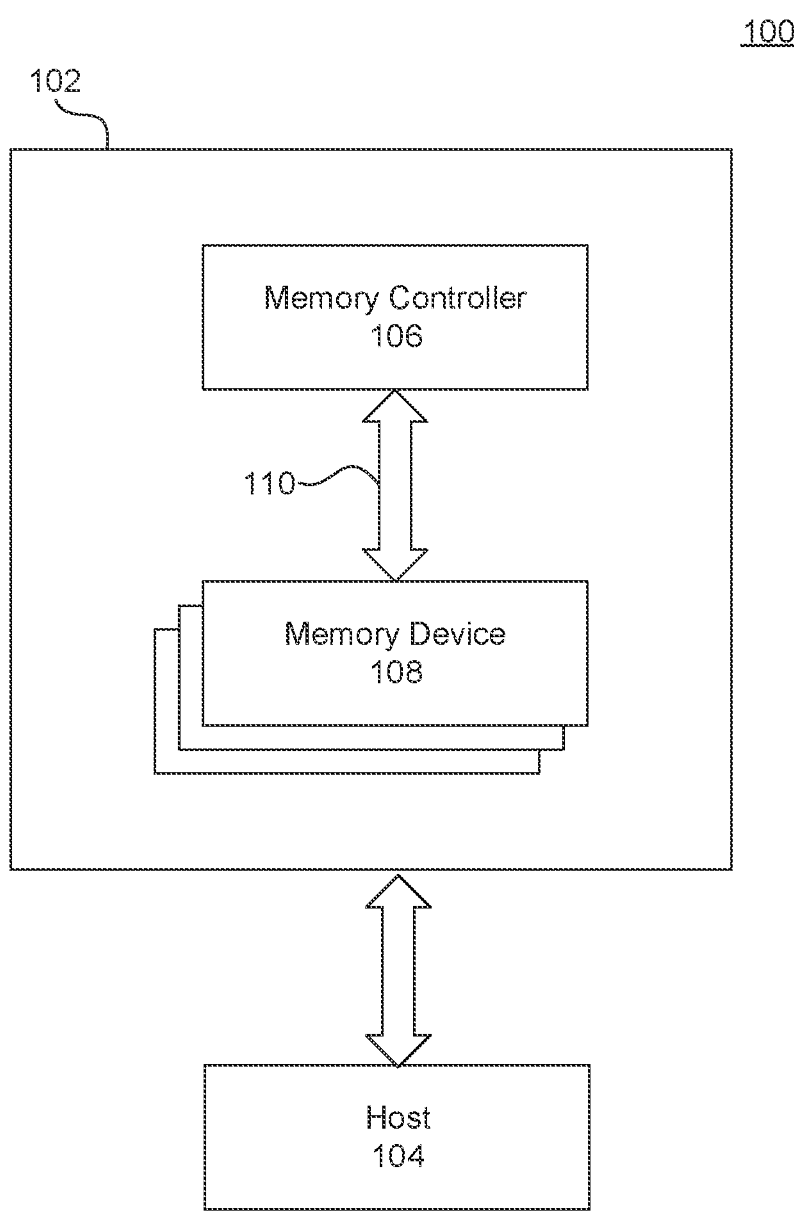
FIG. 1 is a schematic illustration of a memory system with a memory controller and a memory device, according to an exemplary aspect.

The features and exemplary aspects of the aspects will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more aspects that incorporate the features of this present invention. The disclosed aspect(s) merely exemplify the present invention. The scope of the invention is not limited to the disclosed aspect(s). The present invention is defined by the claims appended hereto.

The aspect(s) described, and references in the specification to "one aspect," "an aspect," "an example aspect," "an exemplary aspect," etc., indicate that the aspect(s) described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is understood that it is within the knowledge of one skilled in the art to effect such feature, structure, or characteristic in connection with other aspects whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" or "substantially" or "approximately" as used herein indicates the value of a given quantity that can vary based on a particular technology. Based on the particular technology, the term "about" or "substantially" or "approximately" can indicate a value of a given quantity that varies within, for example, 1-15% of the value (e.g., ±1%, ±2%, ±5%, ±10%, or ±15% of the value).

Aspects of the disclosure may be implemented in hardware, firmware, software, or any combination thereof. Aspects of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; NAND flash devices, electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Before describing such aspects in more detail, however, it is instructive to present example environments in which aspects of the present disclosure may be implemented.

Exemplary Memory System

Figure 2:
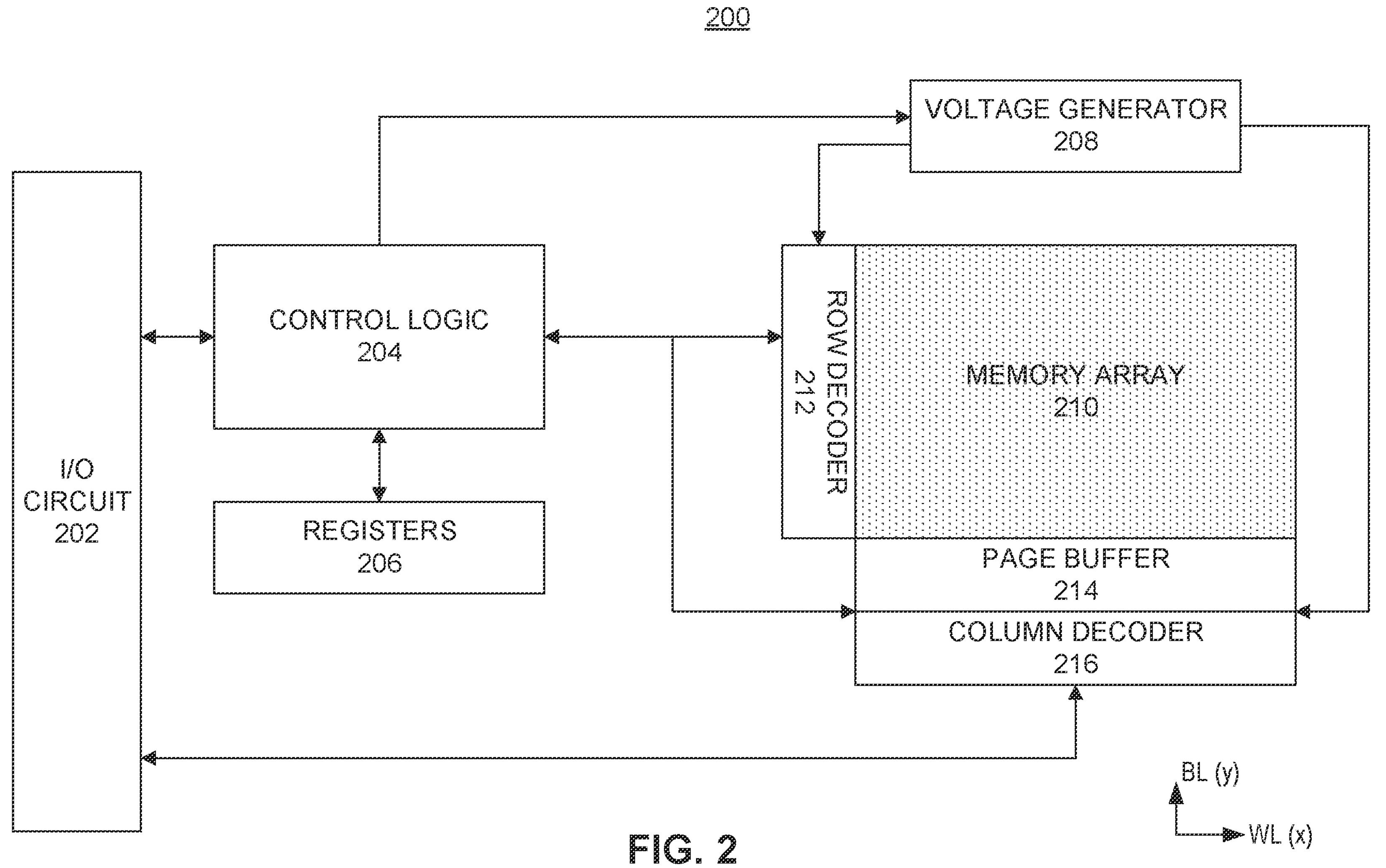
FIG. 2 is a schematic block diagram of a memory device shown in FIG. 1, according to an exemplary aspect.
Figure 3:
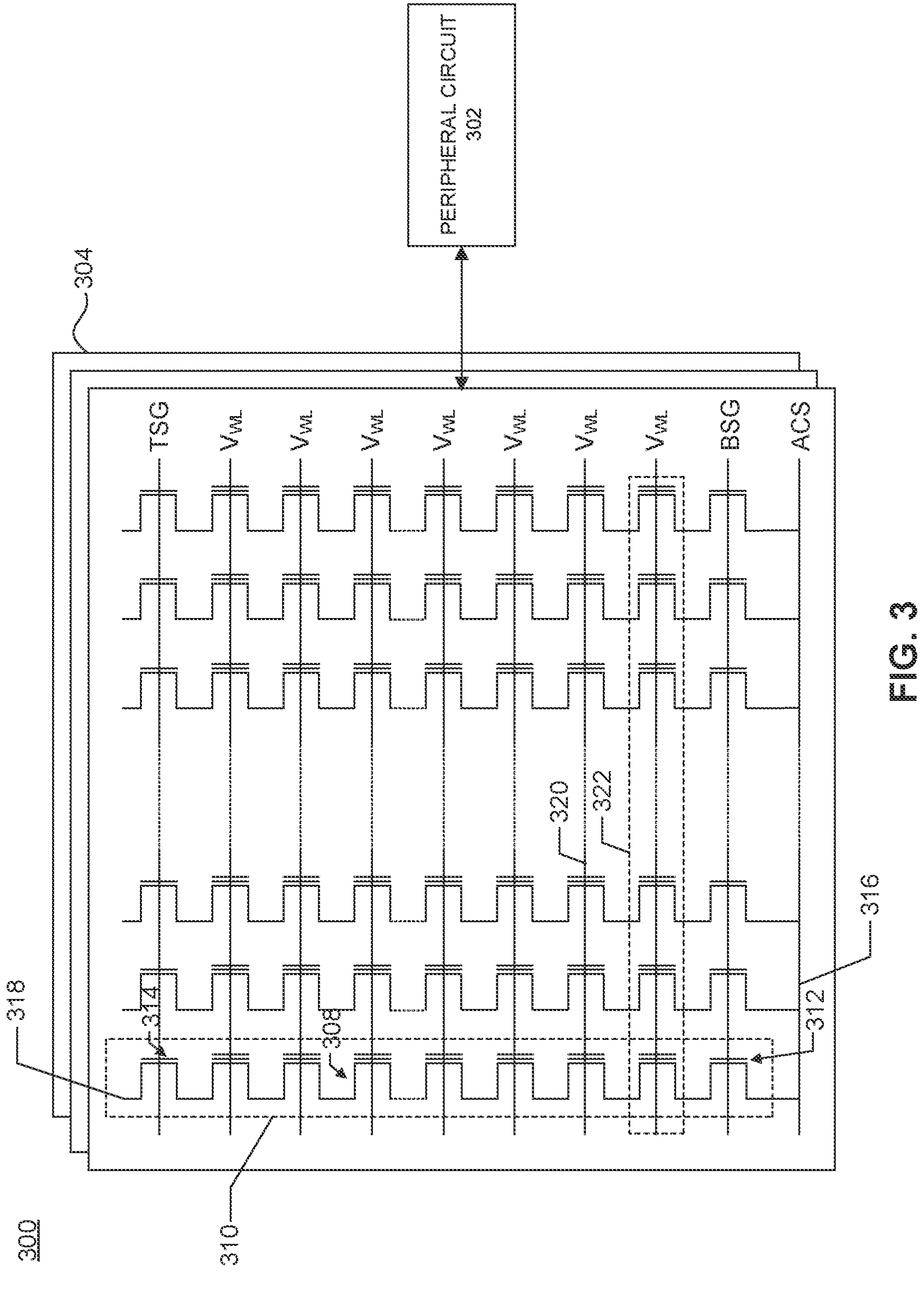
FIG. 3 is a schematic circuit diagram of a memory array of the memory device shown in FIG. 2, according to an exemplary aspect.

FIGS. 1-3 illustrate memory system 100 with memory controller 106 and memory device 108, according to various exemplary aspects. Although memory system 100 is shown in FIGS. 1-3 as a stand-alone apparatus and/or system, the aspects of this disclosure can be used with other apparatuses, systems, and/or methods, such as, but not limited to, memory apparatus 102, memory controller 106, memory device 400, memory device 500, memory device 600, memory device 500', memory device 600', select block programming process 1000, select block programming process 1000', unselect block programming process 1200, and/or unselect block programming process 1200'.

As shown in FIG. 1, memory system 100 can include, but is not limited to, wireless communication devices, smartphones, laptops, desktops, tablets, personal assistant devices, monitors, televisions, wearable devices, Internet of Things (IoT) devices, vehicle communication devices, and the like. Memory system 100 can include a memory apparatus 102 and a host 104. In some aspects, memory apparatus 102 can also be referred to as a solid state drive (SSD), which can include one or more memory devices 108 and memory controller 106. The one or more memory devices 108 can communicate with the host 104 through the memory controller 106, where the memory controller 106 can be connected to the memory device 108 via a memory channel 110. In some aspects, the memory apparatus 102 can have more than one memory device 108, while each memory device 108 can be managed by the memory controller 106. In some aspects, the memory controller 106 can include one or more processors.

Host 104 sends data to be stored at the memory apparatus 102 or retrieves data by reading the memory apparatus 102. Memory controller 106 can handle I/O requests received from the host 104, ensure data integrity and efficient storage, and manage the memory device 108. The memory channel 110 can provide data and control communications between the memory controller 106 and the one or more memory devices 108 via a data bus.

The memory device 108 (e.g., "flash," "NAND flash," "NAND") can be a memory chip (package), a memory die, or any portion of a memory die, and can include one or more memory planes, each of which can include a plurality of memory blocks. Identical and concurrent operations can take place at each memory plane. The memory block, which can be megabytes (MB) in size, is the smallest size to carry out erase operations. In some aspects, the memory device 108 can include four memory planes and each memory plane can include six memory blocks. Each memory block can include a plurality of memory cells, where each memory cell can be addressed through interconnections such as bit lines (BL) and word lines (WL). The bit lines (BL) and word lines (WL) can be laid out perpendicularly (e.g., in rows and columns, respectively), forming an array of metal lines. In this disclosure, the memory block is also referred to as the "memory array" or "array." The memory array is the core area in a memory device, performing storage functions.

FIG. 2 illustrates a schematic block diagram of memory device 200, according to an exemplary aspect. In some aspects, memory device 200 can be an example of memory device 108 shown in FIG. 1. As shown in FIG. 2, memory device 200 can include digital, analog, and/or mixed-signal circuits to support functions of a memory array 210, for example, row decoders 212, page buffers 214, and column decoders 216. Memory device 200 can also include I/O circuit 202, a control logic 204, a register 206, and a voltage generator 208. Control logic 204 can be configured to control other components of the memory device 200. For example, control logic 204 can control voltage generator 208, which generates voltages to be applied to memory cells of memory array 210. Registers 206 can be coupled to control logic 204 and include registration information, such as address information. In some aspects, memory device 200 can communicate with a controller, such as memory controller 106 shown in FIG. 1 via the I/O circuit 202. For example, memory device 200 can receive commands from the controller via the I/O circuit 202 and/or transmit data retrieved from the memory array 210 to the controller.

It is noted that the layout of the electronic components in memory apparatus 102 of FIG. 1 and memory device 200 of FIG. 2 are shown as an example. The memory apparatus 102 and the memory device 200 can have other layouts and can include additional components.

FIG. 3 illustrates a schematic circuit diagram 300 of a memory device, according to an exemplary aspect. The example schematic circuit diagram 300 includes a memory cell array 304 and a peripheral circuit 302. In some aspects, the example schematic circuit diagram 300 can include a plurality of memory strings 310, each memory string 310 having a plurality of memory cells 308. The memory string 310 also includes at least one transistor (e.g., a MOSFET) at each end, which is controlled by a bottom select gate (BSG) 312 and a top select gate (TSG) 314, respectively. The memory cell 308 can be controlled by a control gate, where the control gate can be connected to a word line (WL) 320 of the example schematic circuit diagram 300. The drain terminal of the TSG 314 can be connected to the bit line (BL) 318, and the source terminal of the BSG 312 can be connected to an array common source (ACS) 316. The ACS 316 can be shared by the memory strings 310 in an entire memory block, and is also referred to as the common source line.

In some aspects, the example schematic circuit diagram 300 can be formed based on charge trapping technology. In some aspects, the example schematic circuit diagram 300 can be formed based on the floating gate technology. NAND flash memory based on charge trapping can provide high storage density and high intrinsic reliability. Storage data or logic states (e.g., threshold voltage $V_{th}$ of the memory cell 308) depends on the amount of charge trapped in a storage layer. In some aspects, the memory array 210 can be a three-dimensional (3D) memory device, and the example schematic circuit diagram 300 can be a 3D memory array, where the memory cells 308 can be vertically stacked on top of each other.

In a NAND flash memory, read and write operations can be performed in a memory page 322, which includes all memory cells 308 sharing the same word line (WL). In a NAND memory, the memory cell 308 can be in an erase state (ER) or a programmed state (PN). Initially, all memory cells 308 in the example schematic circuit diagram 300 can be reset to the erase state as logic "1" by implementing a negative voltage difference between control gates and source terminals of the memory cells (e.g., the array common source 316) such that all the trapped electronic charges in the storage layer of the memory cells 308 can be removed. For example, the negative voltage difference can be induced by setting the control gates of the memory cells 308 to ground, and applying a high positive voltage to the array common source 316. At the erase state (ER), the threshold voltage $V_{th}$ of the memory cells 308 can be reset to the lowest value, and can be measured or sensed at the bit line (BL) 318.

During programming (i.e., writing), a programming voltage $V_{pgm}$ (e.g., a positive voltage pulse between 10 V and 20 V) can be applied on the control gate such that electronic charges (e.g., electrons) can be injected into the storage layer of the memory cell 308, and thereby increase the threshold voltage $V_{th}$ of the memory cell 308. Thus, the memory cell 308 is programmed to the programmed state (e.g., P1).

A NAND flash memory can be configured to operate in a single-level cell (SLC) mode. To increase storage capacity, a NAND flash memory can also be configured to operate in a multi-level cell (MLC) mode, a triple-level cell (TLC) mode, a quad-level cell (QLC) mode, or a combination of any of these modes. In the SLC mode, a memory cell stores "1" bit and has two logic states ("states"), i.e., states ER and P1. In the MLC mode, a memory cell stores 2 bits, and has four states, i.e., states ER, P1, P2, and P3. In the TLC mode, a memory cell stores 3 bits, and has eight states, i.e., states ER and P1-P7. In the QLC mode, a memory cell stores 4 bits and has sixteen states, i.e., states ER and P1-P15.

Memory controller 106 can be configured to control memory device 108 (e.g., program memory device 108). Memory controller 106 can be further configured to generate threshold voltage ($V_{th}$) values for corresponding program states (e.g., P0-P7) of binary data.

In some aspects, memory controller 106 can store a program code or other information. For example, memory controller 106 can store a program code (e.g., threshold voltage ($V_{th}$) distribution, voltage distribution, voltage value, program value, verify value, etc.). In some aspects, memory controller 106 can implement an operation method. For example, memory controller 106 can implement an operation method (e.g., select block programming process 1000', unselect block programming process 1200', etc.). In some aspects, memory controller 106 can receive data from a host. For example, memory controller 106 can receive data from host 104.

Exemplary Memory Devices with TSG Cuts

Figure 4A:
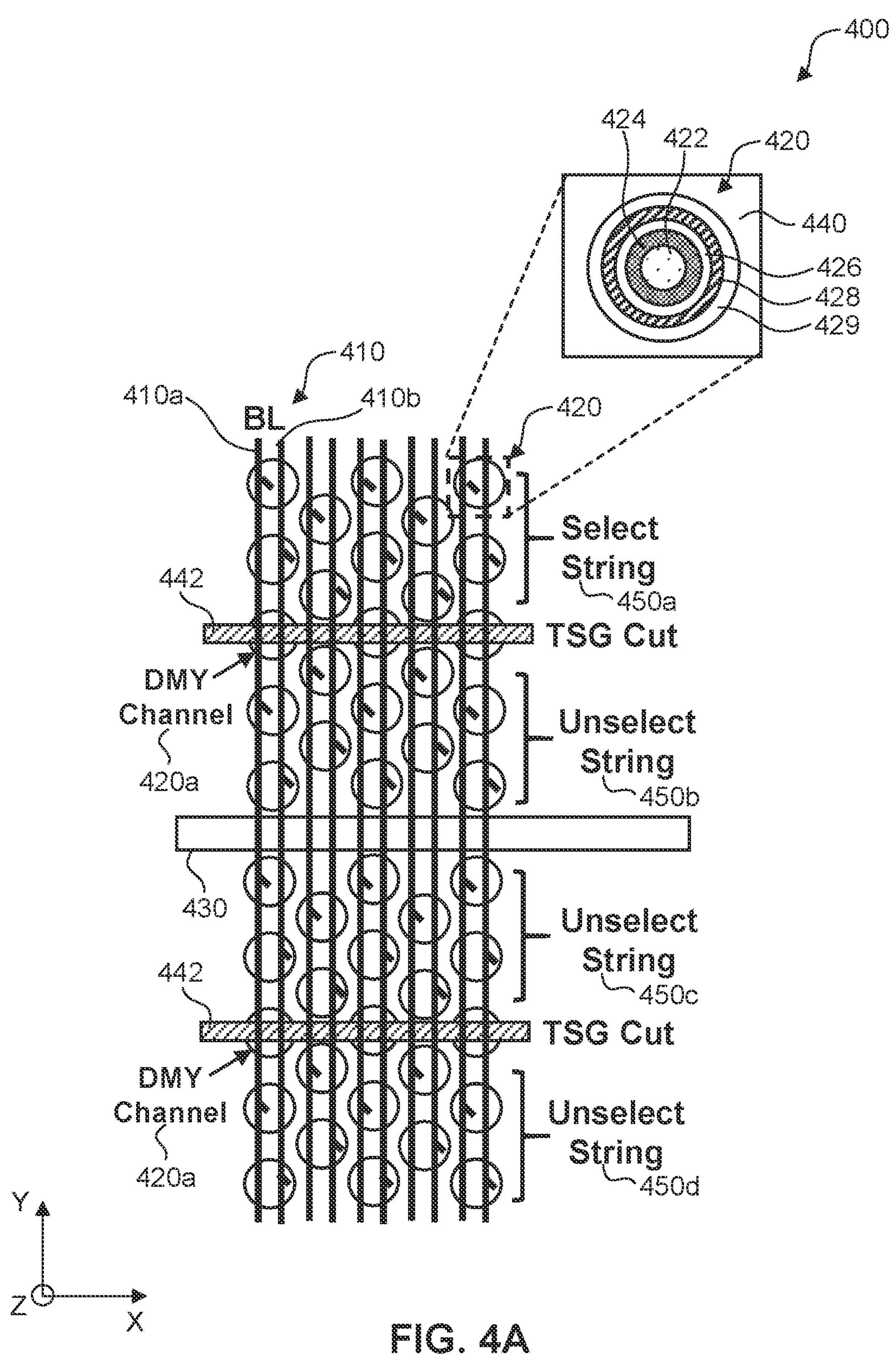
FIG. 4A is a schematic plan view illustration of a memory device with a dummy TSG cut, according to an exemplary aspect.
Figure 4B:
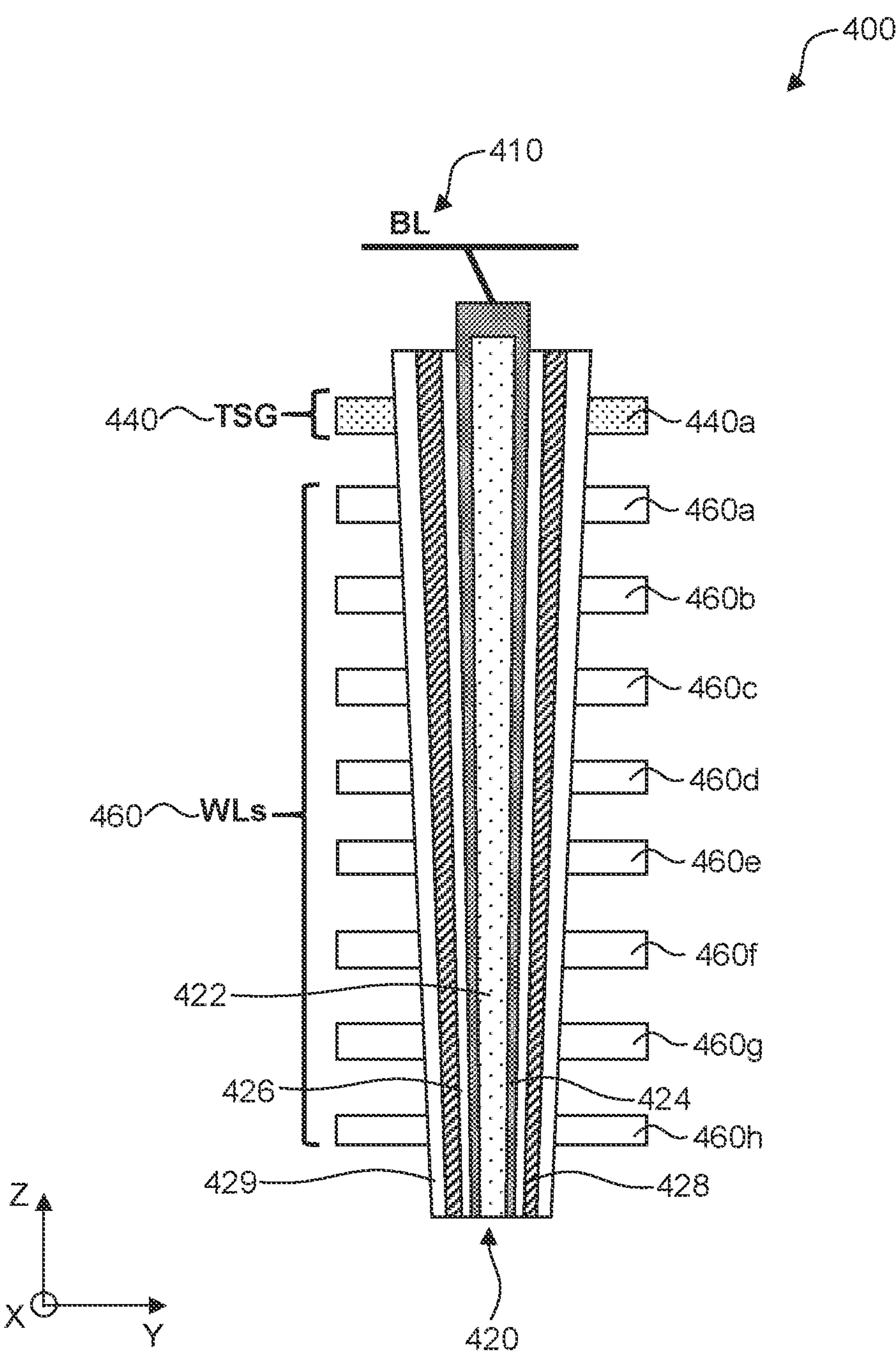
FIG. 4B is a schematic cross-sectional illustration of the memory device shown in FIG. 4A, according to an exemplary aspect.
Figure 5A:
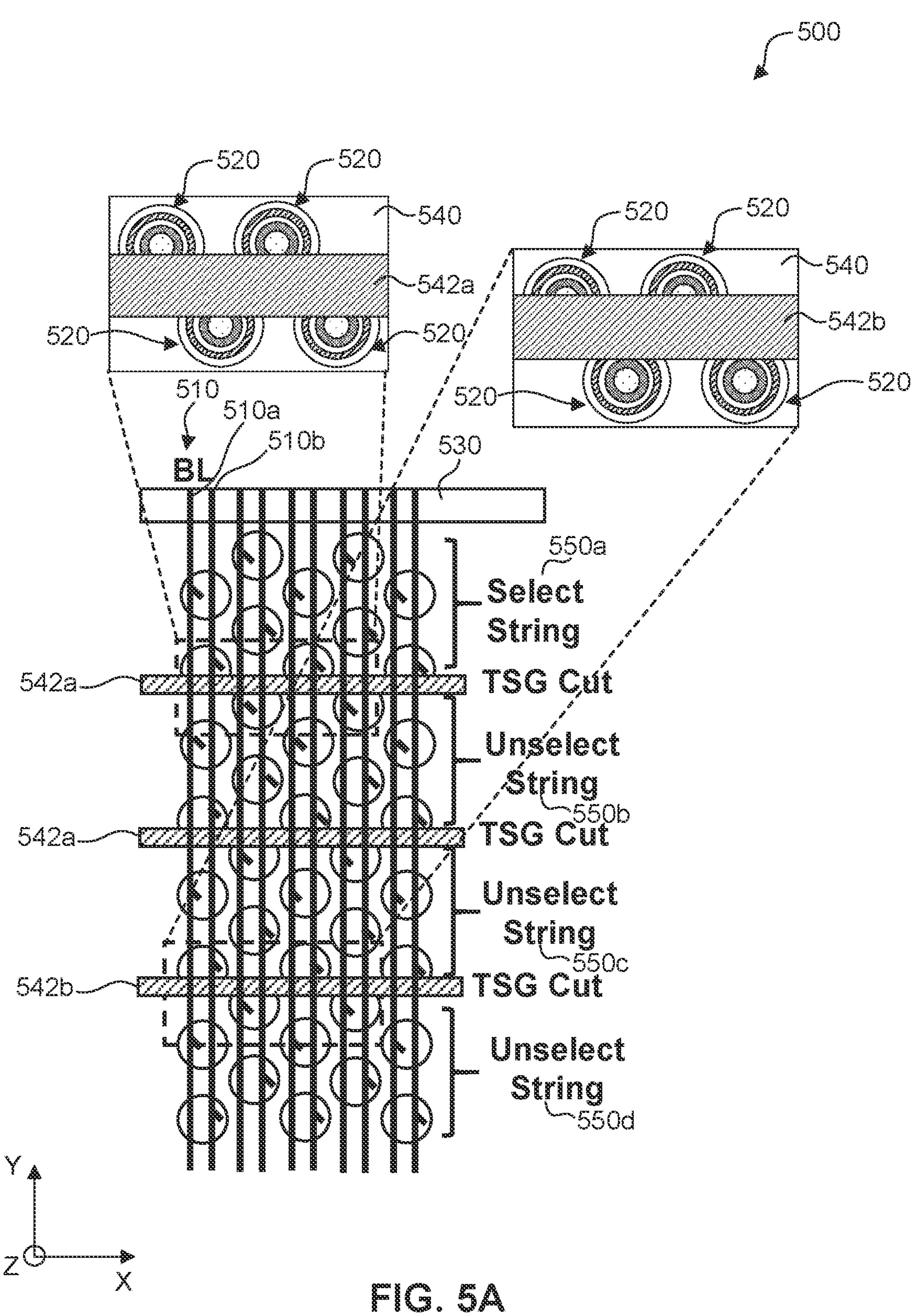
FIG. 5A is a schematic illustration of a memory device with a symmetric TSG cut and an asymmetric TSG cut, according to an exemplary aspect.
Figure 5B:
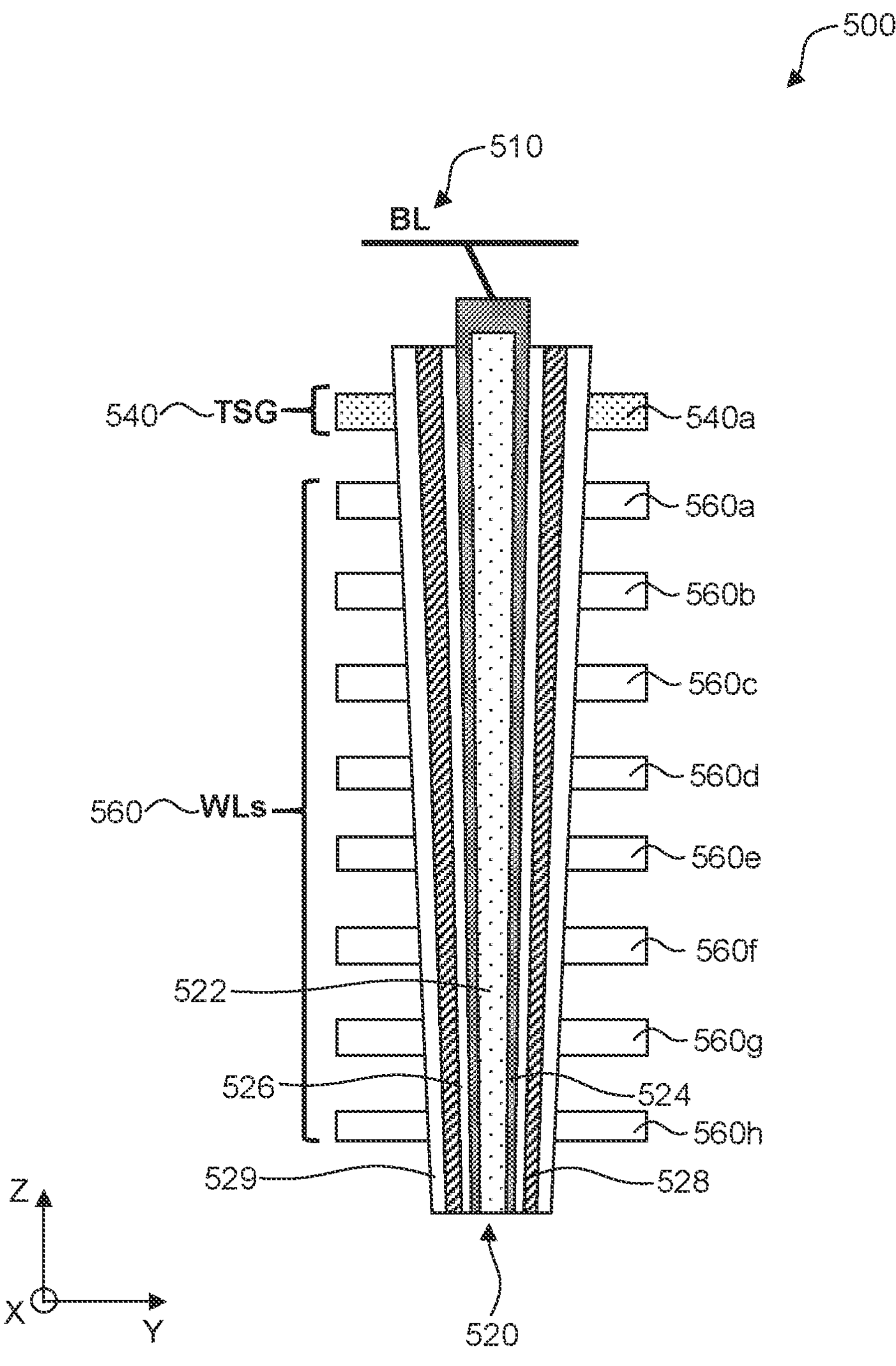
FIG. 5B is a schematic cross-sectional illustration of the memory device shown in FIG. 5A, according to an exemplary aspect.
Figure 6A:
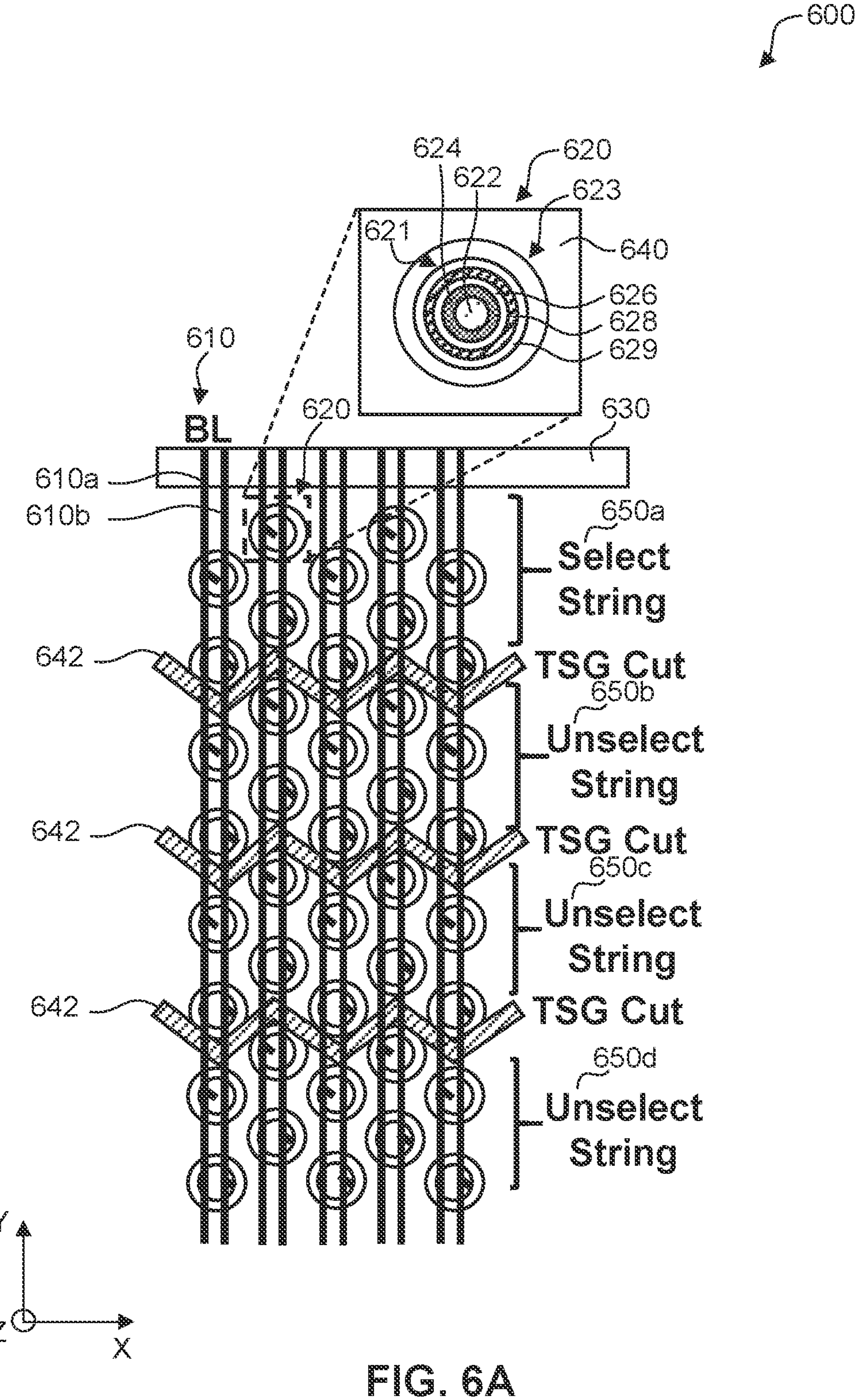
FIG. 6A is a schematic illustration of a memory device with a skewed TSG cut, according to an exemplary aspect.
Figure 6B:
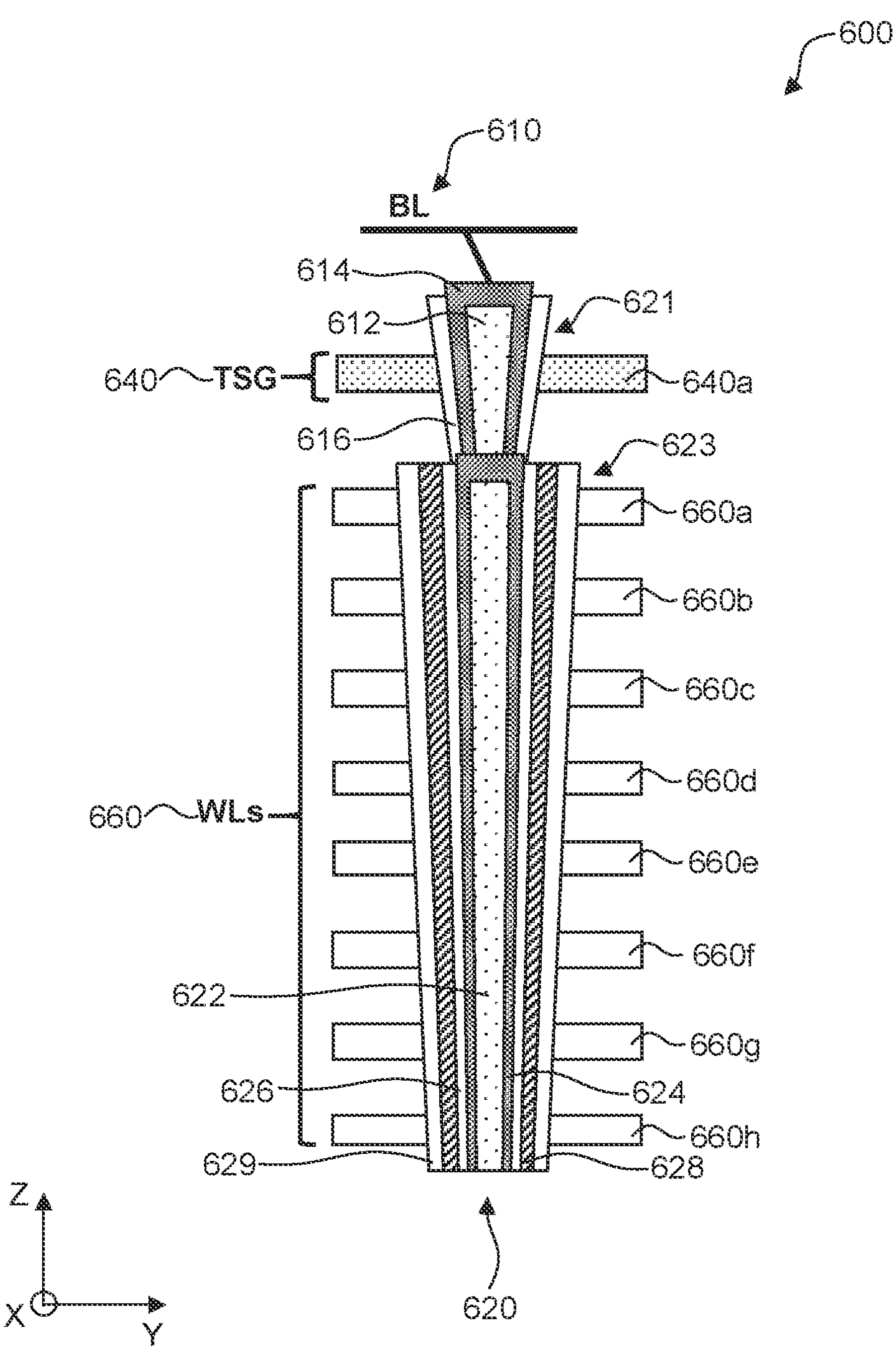
FIG. 6B is a schematic cross-sectional illustration of the memory device shown in FIG. 6A, according to an exemplary aspect.

FIGS. 4A-6B illustrate memory devices 400, 500, 600, according to various exemplary aspects. FIGS. 4A and 4B are schematic illustrations of memory device 400 with dummy TSG cut 442, according to an exemplary aspect. FIGS. 5A and 5B are schematic illustrations of memory device 500 with symmetric TSG cut **542*a* and asymmetric TSG cut 542*b*, according to an exemplary aspect. FIGS. 6A and 6B are schematic illustrations of memory device 600 with skewed TSG cut 642**, according to an exemplary aspect.

Although memory devices 400, 500, 600 are shown in FIGS. 4A-6B as stand-alone apparatuses, systems, and/or methods, the aspects of these disclosures can be used with other apparatuses, systems, and/or methods, such as, but not limited to, memory apparatus 102, memory controller 106, memory system 100, memory device 500', TSG voltage distributions 800, memory device 600', select block programming process 1000, select block programming process 1000', unselect block programming process 1200, and/or unselect block programming process 1200'.

As shown in FIGS. 4A and 4B, memory device 400 can include bit line (BL) 410, memory string 420, dummy channel **420*a*, array common source (ACS) 430, top select gate (TSG) 440, dummy TSG cut 442, memory pages 450*a*-450*d*, and word lines (WLs) 460. Memory device 400 can be configured to distinguish between selected memory strings (e.g., memory string 420 in memory page 450*a*) and unselected memory strings (e.g., memory string 420 in memory pages 450*b*-450*d*) with dummy TSG cut 442 extending along dummy channel 420*a*. For example, as shown in FIG. 4A, dummy TSG cut 442 extends along three dummy channels 420*a* separating memory page 450*a* from memory page 450***b*, and dummy TSG cut 442 extends along three dummy channels 420*a* separating memory page 450*c* from memory page 450*d*.

Bit line (BL) 410 can be configured to address a particular memory string 420 of memory device 400. Bit line (BL) 410 can be connected to two or more serially connected memory cells (e.g., memory string 420). Different voltage combinations applied to bit line (BL) 410 can define read, program (write), and erase operations in memory string 420. As shown in FIG. 4A, bit line (BL) 810 can include a plurality of bit lines 410*a*, 410*b* each extending along the Y-direction (e.g., in plan view) and connected to corresponding memory strings 420 in memory pages 450*a*-450*d*.

Memory string 420 can be configured to store an electrical charge. In some aspects, memory string 420 can include two or more serially connected memory cells (e.g., memory cells 308 of memory string 310 shown in FIG. 3). In some aspects, memory string 420 can include a NAND string (e.g., memory string 310 shown in FIG. 3). As shown in FIGS. 4A and 4B, memory string 420 can include body 422, channel 424, first insulating layer 426, charge trap layer 428, and/or second insulating layer 429. In some aspects, as shown in FIG. 4A, each memory page 450*a*-450*d* can include a plurality of memory strings 420 arranged in an array along the X-direction and the Y-direction (e.g., in plan view).

Dummy channel 420*a* can be configured to provide a non-storage memory string (channel hole) for dummy TSG cut 442. In some aspects, as shown in FIG. 4A, a plurality of dummy channels 420*a* can extend laterally along the X-direction (e.g., in plan view). In some aspects, dummy channels 420*a* can be disposed between memory strings 420 located in different memory pages (e.g., between memory pages 450*a*, 450*b*).

ACS 430 can be configured to address a particular memory string 420 of memory device 400. ACS 430 can be connected to two or more serially connected memory cells (e.g., memory string 420). Different voltage combinations applied to ACS 430 can define read, program (write), and erase operations in memory string 420. In some aspects, ACS 430 can contact a lower portion of memory string 420 and extend along the X-direction and the Y-direction.

TSG 440 can be configured to provide a voltage to a particular memory string 420 to select which row of bits is to be read, programmed, or erased (e.g., memory page 450*a*). As shown in FIGS. 4A and 4B, TSG 440 can contact an upper portion of memory string 420 and extend along the X-direction and the Y-direction. In some aspects, as shown in FIG. 4A, TSG 440 can be divided (e.g., cut through) by dummy TSG cut 442.

Dummy TSG cut 442 can be configured to divide and separate memory pages 450*a*-450*d*. As shown in FIG. 4A, dummy TSG cut 442 can extend along the X-direction (e.g., in plan view) over dummy channels 420*a*. Memory pages 450*a*-450*d* can be configured to distinguish (e.g., select) between selected memory strings (e.g., memory page 450*a*) and unselected memory strings (e.g., memory pages 450*b*-450*d*).

Word lines (WLs) 460 can be configured to provide a voltage to a particular memory cell of memory string 420 to select which row of bits is to be read, programmed, or erased. Different voltage combinations applied to word lines (WLs) 460 can define read, program (write), and erase operations in the memory cell of memory string 420. As shown in FIG. 4B, word lines (WLs) 460 can be arranged along the Z-direction (e.g., in cross-sectional view). As shown in FIG. 4B, word lines (WLs) 460 can be connected to a plurality of corresponding word line contacts 460*a*-460*h* which are coupled to memory string 420.

The aspects of memory device 400 shown in FIGS. 4A and 4B and the aspects of memory device 500 shown in FIGS. 5A and 5B may be similar. Similar reference numbers are used to indicate features of the aspects of memory device 400 shown in FIGS. 4A and 4B and the similar features of the aspects of memory device 500 shown in FIGS. 5A and 5B. In some aspects, as shown in FIGS. 5A and 5B, memory device 500 can include symmetric TSG cut 542*a* and/or asymmetric TSG cut 542*b* and omit any dummy channels, rather than dummy TSG cut 442 along dummy channels 420*a* of memory device 400 shown in FIG. 4A.

As shown in FIGS. 5A and 5B, memory device 500 can include bit line (BL) 510, memory string 520, ACS 530, TSG 540, symmetric TSG cut 542*a*, asymmetric TSG cut 542*b*, memory pages 550*a*-550*d*, and word lines (WLs) 560. Memory device 500 can be configured to distinguish between selected memory strings (e.g., memory strings 520 in memory page 550*a*) and unselected memory strings (e.g., memory strings 520 in memory pages 550*b*-550*d*) with symmetric TSG cut 542*a* and/or asymmetric TSG cut 542*b*. For example, as shown in FIG. 5A, symmetric TSG cut 542*a* extends evenly along portions of five memory strings 520 along the X-direction (e.g., in plan view), separating memory page 550a from memory page 550*b*. For example, as shown in FIG. 5A, asymmetric TSG cut 542*b* extends unevenly along portions of five memory strings 520 along the X-direction (e.g., in plan view), separating memory page 550*c* from memory page 550*d*.

Bit line (BL) 510 can be configured to address a particular memory string 520 of memory device 500. Bit line (BL) 510 can be connected to two or more serially connected memory cells (e.g., memory string 520). Different voltage combinations applied to bit line (BL) 510 can define read, program (write), and erase operations in memory string 520. As shown in FIG. 5A, bit line (BL) 510 can include a plurality of bit lines 510*a*, 510*b* each extending along the Y-direction (e.g., in plan view) and connected to corresponding memory strings 520 in memory pages 550*a*-550*d*.

Memory string 520 can be configured to store an electrical charge. In some aspects, memory string 520 can include two or more serially connected memory cells (e.g., memory cells 308 of memory string 310 shown in FIG. 3). In some aspects, memory string 520 can include a NAND string (e.g., memory string 310 shown in FIG. 3). Memory string 520 can be similar to memory string 420 shown in FIGS. 4A and 4B. In some aspects, as shown in FIG. 5A, each memory page 550*a*-550*d* can include a plurality of memory strings 520 arranged in an array along the X-direction and the Y-direction (e.g., in plan view).

ACS 530 can be configured to address a particular memory string 520 of memory device 500. ACS 530 can be connected to two or more serially connected memory cells (e.g., memory string 520). Different voltage combinations applied to ACS 530 can define read, program (write), and erase operations in memory string 520. In some aspects, ACS 530 can contact a lower portion of memory string 520 and extend along the X-direction and the Y-direction.

TSG 540 can be configured to provide a voltage to a particular memory string 520 to select which row of bits is to be read, programmed, or erased (e.g., memory page 550*a*). As shown in FIGS. 5A and 5B, TSG 540 can contact an upper portion of memory string 520 and extend along the X-direction and the Y-direction. In some aspects, as shown in FIG. 5A, TSG 540 can be divided (e.g., cut through) by symmetric TSG cut 542*a* and/or asymmetric TSG cut 542*b*.

Symmetric TSG cut 542*a* can be configured to evenly divide and separate memory pages 550*a*-550*d* from each other. As shown in FIG. 5A, symmetric TSG cut 542*a* can extend along the X-direction (e.g., in plan view) over a portion of five memory strings 520 (e.g., between memory pages 550*a*, 550*b*). Memory pages 550*a*-550*d* can be configured to distinguish (e.g., select) between selected memory strings (e.g., memory page 550*a*) and unselected memory strings (e.g., memory pages 550*b*-550*d*).

Asymmetric TSG cut 542*b* can be configured to unevenly divide and separate memory pages 550*a*-550*d* from each other. Asymmetric TSG cut 542*b* can be caused from variations in manufacturing processes resulting in a TSG cut shift, for example, along the Y-direction (e.g., in plan view). The TSG cut shift forms asymmetric TSG cut 542*b* with a channel (e.g., channel 424 of memory string 420 shown in FIGS. 4A and 4B) not completely isolated (cut-off). Asymmetric TSG cut 542*b* can cause leakage current in one or more memory strings 520 and decrease TSG reliability in memory device 500. As shown in FIG. 5A, symmetric TSG cut 542*a* can extend along the X-direction (e.g., in plan view) over a portion of five memory strings 520 (e.g., between memory pages 550*c*, 550*d*).

Word lines (WLs) 560 can be configured to provide a voltage to a particular memory cell of memory string 520 to select which row of bits is to be read, programmed, or erased. Different voltage combinations applied to word lines (WLs) 560 can define read, program (write), and erase operations in the memory cell of memory string 520. As shown in FIG. 5B, word lines (WLs) 560 can be arranged along the Z-direction (e.g., in cross-sectional view). As shown in FIG. 5B, word lines (WLs) 560 can be connected to a plurality of corresponding word line contacts 560*a*-560*h* which are coupled to memory string 520.

The aspects of memory device 500 shown in FIGS. 5A and 5B and the aspects of memory device 600 shown in FIGS. 6A and 6B may be similar. Similar reference numbers are used to indicate features of the aspects of memory device 500 shown in FIGS. 5A and 5B and the similar features of the aspects of memory device 600 shown in FIGS. 6A and 6B. In some aspects, as shown in FIGS. 6A and 6B, memory device 600 can include skewed TSG cut 642 and memory string 620 with extended memory string 621, rather than symmetric TSG cut 542*a* and/or asymmetric TSG cut 542*b* of memory device 500 shown in FIG. 5A.

As shown in FIGS. 6A and 6B, memory device 600 can include bit line (BL) 610, memory string 620 with extended memory string 621 and embedded memory string 623, ACS 630, TSG 640, skewed TSG cut 642, memory pages 650*a*-650*d*, and word lines (WLs) 660. Memory device 600 can be configured to distinguish between selected memory strings (e.g., memory strings 620 in memory page 650*a*) and unselected memory strings (e.g., memory strings 620 in memory pages 650*b*-650*d*) with skewed TSG cut 642 and extended memory strings 621. For example, as shown in FIG. 6A, skewed TSG cut 642 (e.g., zig-zag shape) extends between extended memory strings 621 of five memory strings 620 along the X-direction (e.g., in plan view), separating memory pages 650*a*-650*d* from each other.

Bit line (BL) 610 can be configured to address a particular memory string 620 of memory device 600. Bit line (BL) 610 can be connected to two or more serially connected memory cells (e.g., memory string 620). Different voltage combinations applied to bit line (BL) 610 can define read, program (write), and erase operations in memory string 620. As shown in FIG. 6A, bit line (BL) 610 can include a plurality of bit lines 610*a*, 610*b* each extending along the Y-direction (e.g., in plan view) and connected to corresponding memory strings 620 in memory pages 650*a*-650*d*.

Memory string 620 can be configured to store an electrical charge. In some aspects, memory string 620 can include two or more serially connected memory cells (e.g., memory cells 308 of memory string 310 shown in FIG. 3). In some aspects, memory string 620 can include a NAND string (e.g., memory string 310 shown in FIG. 3). Memory string 620 can be similar to memory string 520 shown in FIGS. 5A and 5B. As shown in FIGS. 6A and 6B, memory string 620 can include extended memory string 621, extended body 612, extended channel 614, extended insulating layer 616, embedded memory string 623, body 622, channel 624, first insulating layer 626, charge trap layer 628, and/or second insulating layer 629. In some aspects, embedded memory string 623 can be similar to memory string 520 shown in FIGS. 5A and 5B. In some aspects, as shown in FIG. 6A, each memory page 650*a*-650*d* can include a plurality of memory strings 620 arranged in an array along the X-direction and the Y-direction (e.g., in plan view).

As shown in FIGS. 6A and 6B, memory string 620 can include extended memory string 621 and embedded memory string 623. In some aspects, as shown in FIG. 6B, extended memory string 621 can be disposed atop embedded memory string 623. In some aspects, as shown in FIGS. 6A and 6B, extended memory string 621 can have a smaller critical dimension (e.g., diameter) than embedded memory string 623. In some aspects, extended memory string 621 can extend through TSG 640.

In some aspects, embedded memory string 623 can be similar to memory string 420 shown in FIGS. 4A and 4B. In some aspects, embedded memory string 623 can include body 622, channel 624, first insulating layer 626, charge trap layer 628, and/or second insulating layer 629. In some aspects, as shown in FIG. 6B, embedded memory string 623 can be disposed below and isolated from TSG 640. In some aspects, as shown in FIG. 6B, embedded memory string 623 can contact word lines (WLs) 660.

In some aspects, extended memory string 621 can include the same materials as embedded memory string 623 (e.g., similar to memory string 420 shown in FIGS. 4A and 4B). In some aspects, extended memory string 621 can omit one or more materials of embedded memory string 623. For example, extended memory string 621 can omit first insulating layer 626 and/or charge trap layer 628 of embedded memory string 623, for example, to increase manufacturing efficiency and increase memory density. In some aspects, as shown in FIG. 6B, extended memory string 621 can include extended body 612, extended channel 614, and extended insulating layer 616. In some aspects, extended memory string 621 can include body 622, channel 624, and/or second insulating layer 629 of embedded memory string 623.

ACS 630 can be configured to address a particular memory string 620 of memory device 600. ACS 630 can be connected to two or more serially connected memory cells (e.g., memory string 620). Different voltage combinations applied to ACS 630 can define read, program (write), and erase operations in memory string 620. In some aspects, ACS 630 can contact a lower portion of memory string 620 and extend along the X-direction and the Y-direction.

TSG 640 can be configured to provide a voltage to a particular memory string 620 to select which row of bits is to be read, programmed, or erased (e.g., memory page 650*a*). As shown in FIGS. 6A and 6B, TSG 640 can contact extended memory string 621 of memory string 620 and extend along the X-direction and the Y-direction. In some aspects, as shown in FIG. 6A, TSG 640 can be divided (e.g., cut through) by skewed TSG cut 642 (e.g., zig-zag shape).

Skewed TSG cut 642 can be configured to divide and separate memory pages 650*a*-650*d* from each other. As shown in FIG. 6A, skewed TSG cut 642 can extend along the X-direction (e.g., in plan view) between extended memory strings 621 of five memory strings 620 (e.g., between memory pages 650*a*, 650*b*). In some aspects, as shown in FIG. 6A, skewed TSG cut 642 can include a zig-zag shape, for example, along the X-direction (e.g., in plan view) between adjacent memory strings 620. Memory pages 650*a*-650*d* can be configured to distinguish (e.g., select) between selected memory strings (e.g., memory page 650*a*) and unselected memory strings (e.g., memory pages 650*b*-650*d*).

Word lines (WLs) 660 can be configured to provide a voltage to a particular memory cell of memory string 620 to select which row of bits is to be read, programmed, or erased. Different voltage combinations applied to word lines (WLs) 660 can define read, program (write), and erase operations in the memory cell of memory string 620. As shown in FIG. 6B, word lines (WLs) 660 can be arranged along the Z-direction (e.g., in cross-sectional view). In some aspects, word lines (WLs) 660 can contact embedded memory string 623 of memory string 620. As shown in FIG. 6B, word lines (WLs) 660 can be connected to a plurality of corresponding word line contacts 660*a*-660*h* which are coupled to memory string 620.

Exemplary Memory Devices with Adaptable TSG Control

As discussed above, as the length of the memory strings increases, variations in manufacturing processes can cause a lateral TSG cut position to shift (e.g., asymmetric TSG cut 542*b* shown in FIG. 5A). The shift in TSG cut position can lead to asymmetric TSG cuts (e.g., asymmetric TSG cut 542*b* shown in FIG. 5A) that can increase leakage current (e.g., channel is not completely isolated) and decrease TSG reliability over time. Further, as critical dimensions (e.g., diameter) of memory strings decrease (e.g., extended memory string 621 shown in FIGS. 6A and 6B), adaptable TSG control (e.g., fine tuning a threshold voltage ($V_{th}$)) is needed to maintain TSG reliability.

Aspects of memory apparatuses, systems, and methods as discussed below can provide adjustable top select gate (TSG) control to intrinsically increase a coarse threshold voltage ($V_{th\_coarse}$), decrease leakage current, dynamically adjust and fine tune threshold voltages ($V_{th}$), increase TSG reliability, reduce critical dimensions, and improve manufacturing efficiency.

Figure 7:
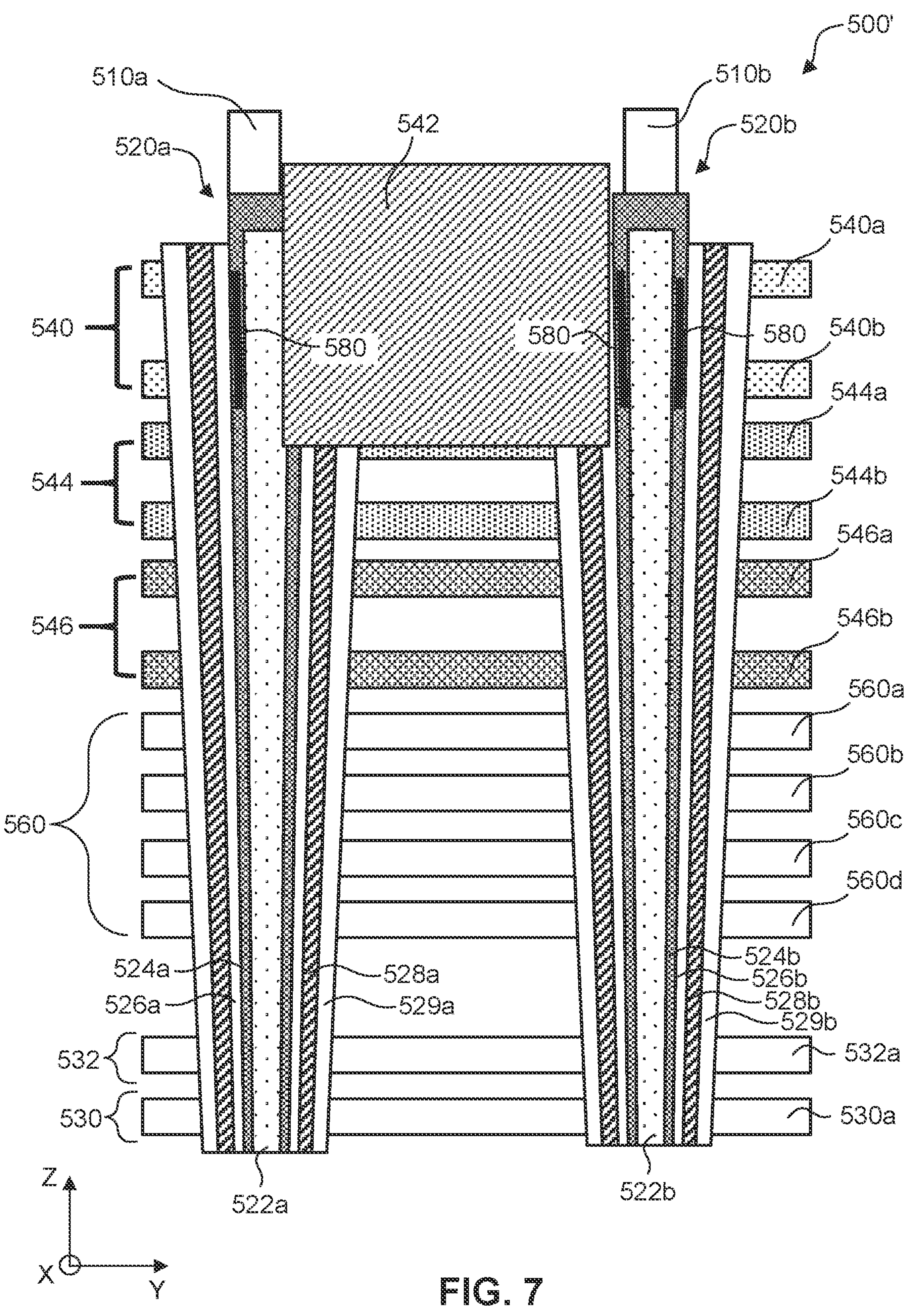
FIG. 7 is a schematic illustration of a memory device with an asymmetric TSG cut, according to an exemplary aspect.
Figure 8:
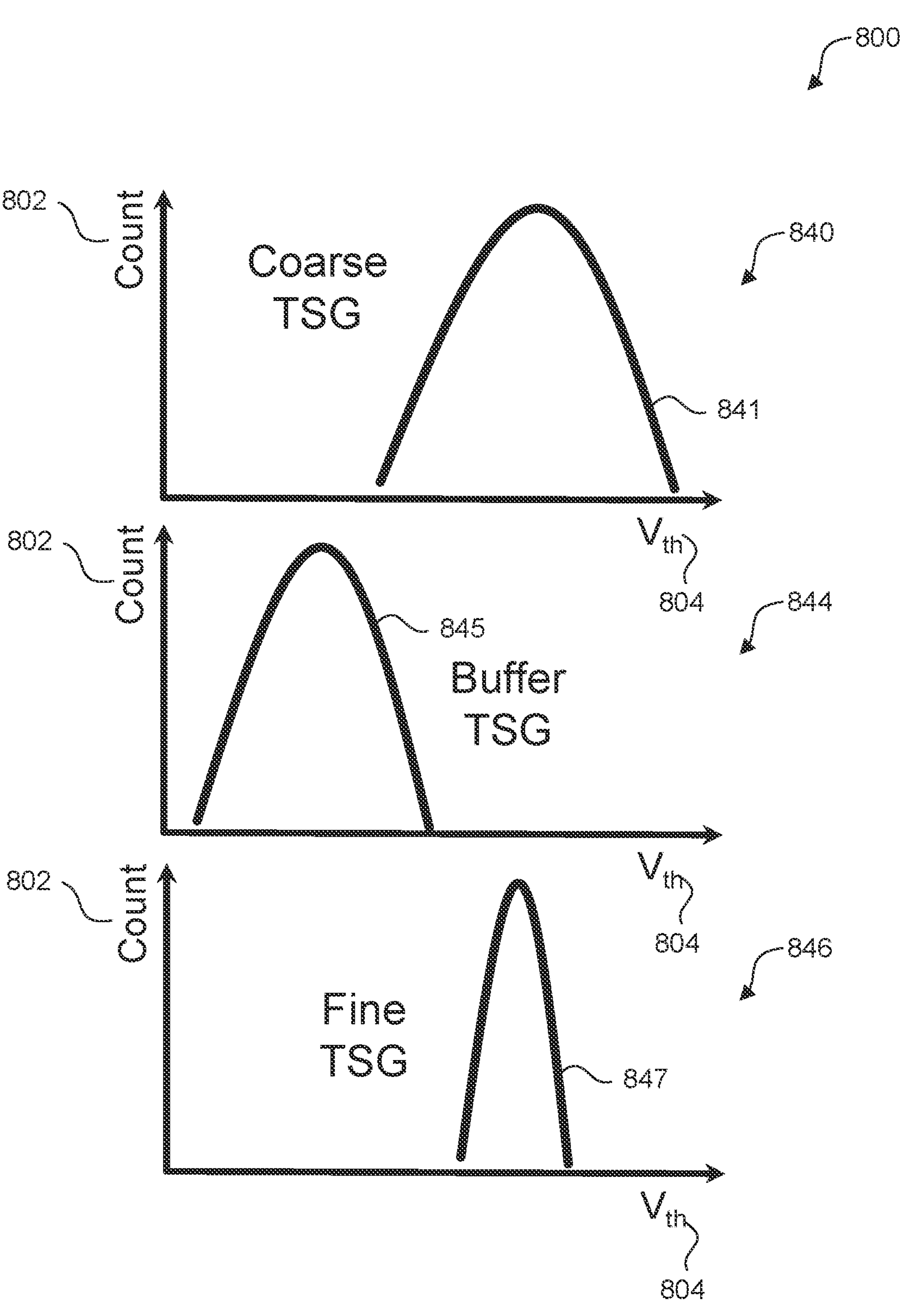
FIG. 8 is a schematic illustration of TSG voltage distributions of the memory device shown in FIG. 7, according to an exemplary aspect.
Figure 9:
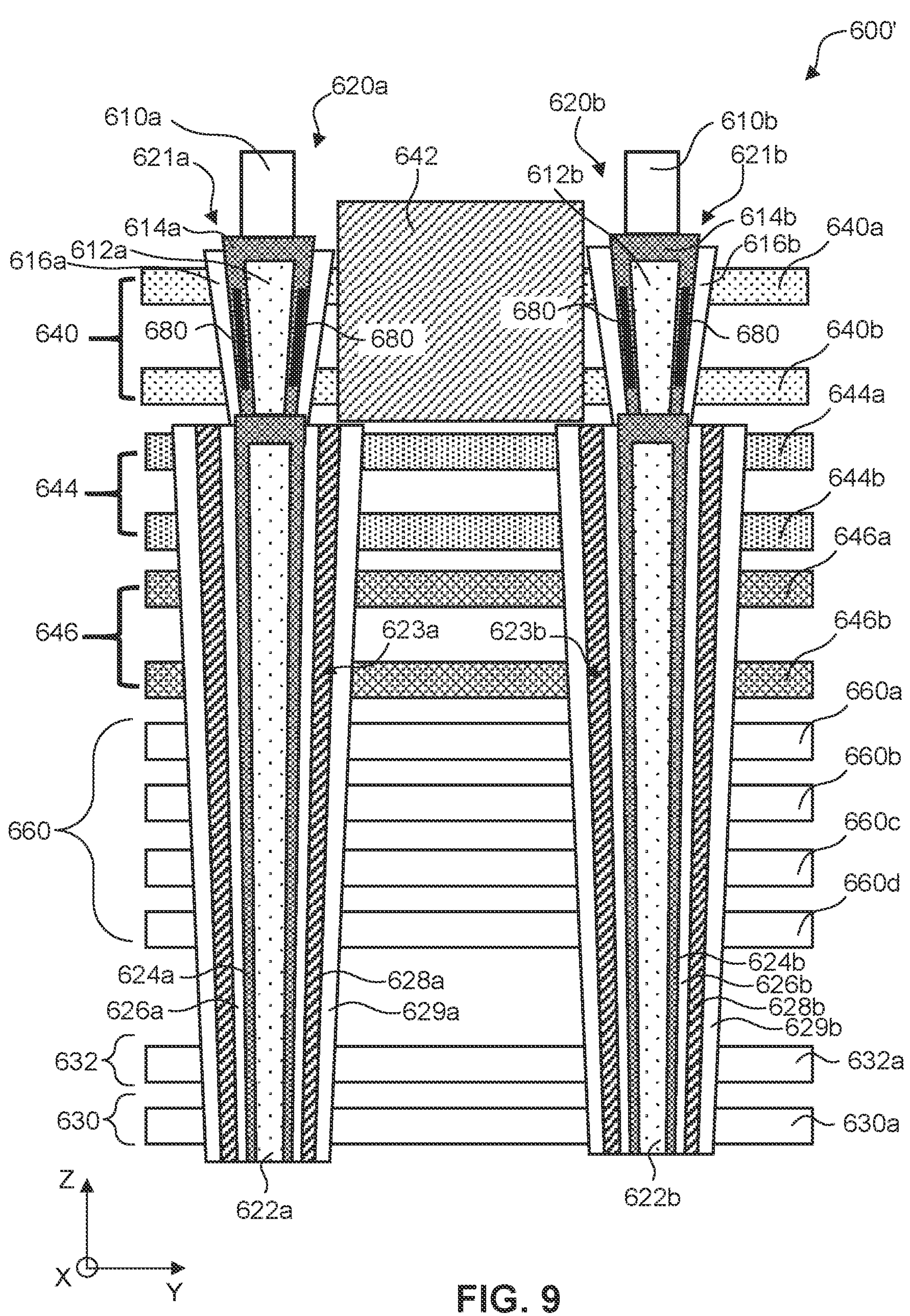
FIG. 9 is a schematic illustration of a memory device with a skewed TSG cut, according to an exemplary aspect.

FIGS. 7-9 illustrate memory devices 500', 600', according to various exemplary aspects. FIG. 7 is a schematic illustration of memory device 500' with asymmetric TSG cut 542, according to an exemplary aspect. FIG. 8 is a schematic illustration of TSG voltage distributions 800 of memory device 500' shown in FIG. 7, according to an exemplary aspect. FIG. 9 is a schematic illustration of memory device 600' with skewed TSG cut 642, according to an exemplary aspect.

Although memory devices 500', 600' are shown in FIGS. 7-9 as stand-alone apparatuses, systems, and/or methods, the aspects of these disclosures can be used with other apparatuses, systems, and/or methods, such as, but not limited to, memory apparatus 102, memory controller 106, memory system 100, memory device 400, memory device 500, memory device 600, select block programming process 1000, select block programming process 1000', unselect block programming process 1200, and/or unselect block programming process 1200'.

The aspects of memory device 500 shown in FIGS. 5A and 5B and the aspects of memory device 500' shown in FIG. 7 may be similar. Similar reference numbers are used to indicate features of the aspects of memory device 500 shown in FIGS. 5A and 5B and the similar features of the aspects of memory device 500' shown in FIG. 7. In some aspects, as shown in FIG. 7, memory device 500' can include coarse TSG 540, buffer TSG 544, and fine TSG 546, rather than TSG 540 of memory device 500 shown in FIGS. 5A and 5B.

As shown in FIG. 7, memory device 500' can include bit lines (BL) 510*a*, 510*b*, memory strings 520*a*, 520*b*, ACS 530, bottom select gate (BSG) 532, coarse TSG 540, asymmetric TSG cut 542, buffer TSG 544, fine TSG 546, and word lines (WLs) 560. Memory device 500' can be configured to intrinsically increase a coarse threshold voltage ($V_{th\_coarse}$) (e.g., coarse threshold voltage ($V_{th\_coarse}$) 841 shown in FIG. 8) and decrease leakage current in memory strings 520*a*, 520*b* through doping (e.g., channel doping 580). Memory device 500' can be further configured to provide adjustable TSG control with coarse TSG 540, buffer TSG 544, and fine TSG 546 to dynamically adjust and fine tune a threshold voltage ($V_{th}$) of memory strings 520*a*, 520*b* and increase TSG reliability.

Bit lines (BL) 510*a*, 510*b* can be configured to address memory strings 520*a*, 520*b* of memory device 500', respectively. Each bit line (BL) 510*a*, 510*b* can be connected to two or more serially connected memory cells (e.g., in corresponding memory strings 520*a*, 520*b*). Different voltage combinations applied to bit lines (BL) 510*a*, 510*b* can define read, program (write), and erase operations in memory strings 520*a*, 520*b*, respectively. As shown in FIG. 7, bit lines (BL) 510*a*, 510*b* can be connected to an upper portion of memory strings 520*a*, 520*b*, respectively, for example, channel 524*a*, 524*b* (e.g., similar to channel 524 shown in FIGS. 5A and 5B). In some aspects, bit lines (BL) 510*a*, 510*b* can each extend along the Y-direction.

Memory strings 520*a*, 520*b* can each be configured to store electrical charge. In some aspects, memory strings 520*a*, 520*b* can each include two or more serially connected memory cells (e.g., memory cells 308 of memory string 310 shown in FIG. 3). In some aspects, memory strings 520*a*, 520*b* can each include a NAND string (e.g., memory string 310 shown in FIG. 3). Memory strings 520*a*, 520*b* can each be similar to memory string 520 shown in FIGS. 5A and 5B. As shown in FIG. 7, memory strings 520*a*, 520*b* can include body 522*a*, 522*b*, channel 524*a*, 524*b*, first insulating layer 526*a*, 526*b*, charge trap layer 528*a*, 528*b*, and/or second insulating layer 529*a*, 529*b*, respectively.

In some aspects, a portion of memory strings 520*a*, 520*a* can each be doped. For example, as shown in FIG. 7, an upper channel region of memory strings 520*a*, 520*b* (e.g., adjacent coarse TSG 540) can each include channel doping 580. In some aspects, channel doping 580 can include p-type doping of channel 524*a*, 524*b*. In some aspects, channel doping 580 can extend along channel 524*a*, 524*b* adjacent coarse TSG 540 (e.g., first and second coarse TSG contacts 540*a*, 540*b*). In some aspects, channel doping 580 can be configured to intrinsically adjust (e.g., increase) a coarse threshold voltage ($V_{th\_coarse}$) (e.g., coarse threshold voltage ($V_{th\_coarse}$) 841 shown in FIG. 8). In some aspects, for example, channel doping 580 can adjust the coarse threshold voltage ($V_{th\_coarse}$) in a range from about 2 V to about 5 V. In some aspects, for example, channel doping 580 can adjust the coarse threshold voltage ($V_{th\_coarse}$) in a range from about 0 V to about 10 V. In some aspects, channel doping 580 can be configured to decrease leakage current in memory strings 520*a*, 520*b*. For example, a leakage current can be decreased between bit lines (BL) 510*a*, 510*b* and coarse TSG 540 due to channel doping 580.

ACS 530 can be configured to address memory strings 520*a*, 520*b* of memory device 500'. ACS 530 can include ACS contact 530*a* connected to two or more serially connected memory cells (e.g., memory strings 520*a*, 520*b*). Different voltage combinations applied to ACS 530 can define read, program (write), and erase operations in memory strings 520*a*, 520*b*. In some aspects, as shown in FIG. 7, ACS contact 530*a* can contact a lower portion of memory strings 520*a*, 520*b* and extend along the X-direction and the Y-direction.

BSG 532 can be configured to address memory strings 520*a*, 520*b* of memory device 500'. BSG 532 can include BSG contact 532*a* connected to two or more serially connected memory cells (e.g., memory strings 520*a*, 520*b*). In some aspects, as shown in FIG. 7, BSG contact 532*a* can contact a lower portion of memory strings 520*a*, 520*b* and extend along the X-direction and the Y-direction.

Coarse TSG 540 can be configured to provide a coarse voltage (e.g., threshold voltage ($V_{th}$)) to memory strings 520*a*, 520*b* to select which row of bits is to be read, programmed, or erased. Coarse TSG 540 can be configured to address memory strings 520*a*, 520*b*. Coarse TSG 540 can be further configured to provide a coarse threshold voltage ($V_{th\_coarse}$) (e.g., coarse TSG voltage 841 shown in FIG. 8) for programming memory strings 520*a*, 520*b*. In some aspects, the coarse threshold voltage ($V_{th\_coarse}$) (e.g., coarse TSG voltage 841 shown in FIG. 8) can include a range from about 2 V to about 5 V. In some aspects, the coarse threshold voltage ($V_{th\_coarse}$) (e.g., coarse TSG voltage 841 shown in FIG. 8) can include a range from about 0 V to about 10 V. Coarse TSG 540 can be further configured to provide dynamic adjustment and fine tuning of a threshold voltage ($V_{th}$) of memory strings 520*a*, 520*b* and increase TSG reliability.

As shown in FIG. 7, coarse TSG 540 can contact an upper portion of memory strings 520*a*, 520*b* and extend along the X-direction and the Y-direction. In some aspects, coarse TSG 540 can include a plurality of contacts to memory strings 520*a*, 520*b*. For example, as shown in FIG. 7, coarse TSG 540 can include first and second coarse TSG contacts 540*a*, 540*b*. In some aspects, as shown in FIG. 7, coarse TSG 540 can be divided (e.g., cut through) by asymmetric TSG cut 542.

Asymmetric TSG cut 542 can be configured to unevenly divide and separate memory pages (e.g., memory pages 550*a*-550*d* shown in FIGS. 5A and 5B) from each other. Asymmetric TSG cut 542 can be caused from variations in manufacturing processes resulting in a TSG cut shift, for example, along the Y-direction. The TSG cut shift forms asymmetric TSG cut 542 with a channel (e.g., channel 524*b* of memory string 520*b* shown in FIG. 7) not completely isolated (cut-off). Any leakage current caused by asymmetric TSG cut 542 can be decreased due to channel doping 580 in channels 524*a*, 524*b* in an upper channel region (e.g., adjacent coarse TSG 540). In some aspects, asymmetric TSG cut 542 can extend into a channel of one of memory strings 520*a*, 520*b* but not the other. For example, as shown in FIG. 7, asymmetric TSG cut 542 extends into channel 524*a* of memory string 520*a* but not into channel 524*b* of memory string 520*b*.

In some aspects, asymmetric TSG cut 542 can be a symmetric TSG cut (e.g., similar to symmetric TSG cut 542*a* shown in FIG. 5A) configured to evenly divide and separate memory pages (e.g., memory pages 550*a*-550*d* shown in FIG. 5A) from each other. For example, asymmetric TSG cut 542 can extend into both channels 524*a*, 524*b* of memory strings 520*a*, 520*b*, respectively.

Buffer TSG 544 can be configured to provide a buffer voltage (e.g., threshold voltage ($V_{th}$)) to memory strings 520*a*, 520*b* to select which row of bits is to be read, programmed, or erased. Buffer TSG 544 can be configured to address memory strings 520*a*, 520*b*. Buffer TSG 544 can be further configured to provide a buffer threshold voltage ($V_{th\_buffer}$) (e.g., buffer TSG voltage 845 shown in FIG. 8) for programming memory strings 520*a*, 520*b*. Buffer TSG 544 can be further configured to provide a buffer or isolation between coarse TSG 540 and fine TSG 546. In some aspects, the buffer threshold voltage ($V_{th\_buffer}$) (e.g., buffer TSG voltage 845 shown in FIG. 8) can include a range from about 0 V to about 2 V. In some aspects, the buffer threshold voltage ($V_{th\_buffer}$) (e.g., buffer TSG voltage 845 shown in FIG. 8) can include a range from about 0 V to about 5 V. Buffer TSG 544 can be further configured to provide dynamic adjustment and fine tuning of a threshold voltage ($V_{th}$) of memory strings 520*a*, 520*b* and increase TSG reliability.

As shown in FIG. 7, buffer TSG 544 can contact an upper portion of memory strings 520*a*, 520*b* and extend along the X-direction and the Y-direction. In some aspects, as shown in FIG. 7, buffer TSG 544 can be disposed below coarse TSG 540. In some aspects, buffer TSG 544 can include a plurality of contacts to memory strings 520*a*, 520*b*. For example, as shown in FIG. 7, buffer TSG 544 can include first and second buffer TSG contacts 544*a*, 544*b*.

Fine TSG 546 can be configured to provide a fine voltage (e.g., threshold voltage ($V_{th}$)) to memory strings 520*a*, 520*b* to select which row of bits is to be read, programmed, or erased. Fine TSG 546 can be configured to address memory strings 520*a*, 520*b*. Fine TSG 546 can be further configured to provide a fine threshold voltage ($V_{th\_fine}$) (e.g., fine TSG voltage 847 shown in FIG. 8) for programming memory strings 520*a*, 520*b*. Fine TSG 546 can be further configured to provide fine adjustment of the coarse voltage of coarse TSG 540. In some aspects, the fine threshold voltage ($V_{th\_fine}$) (e.g., fine TSG voltage 847 shown in FIG. 8) can include a range from about 2 V to about 2.2 V. In some aspects, the fine threshold voltage ($V_{th\_fine}$) (e.g., fine TSG voltage 847 shown in FIG. 8) can include a range from about 1 V to about 3 V. Fine TSG 546 can be further configured to provide dynamic adjustment and fine tuning of a threshold voltage ($V_{th}$) of memory strings 520*a*, 520*b* and increase TSG reliability.

As shown in FIG. 7, fine TSG 546 can contact an upper portion of memory strings 520*a*, 520*b* and extend along the X-direction and the Y-direction. In some aspects, as shown in FIG. 7, fine TSG 546 can be disposed below buffer TSG 544. In some aspects, as shown in FIG. 7, buffer TSG 544 can be arranged atop fine TSG 546, and coarse TSG 540 can be arranged atop buffer TSG 544. In some aspects, fine TSG 546 can include a plurality of contacts to memory strings 520*a*, 520*b*. For example, as shown in FIG. 7, fine TSG 546 can include first and second fine TSG contacts 546*a*, 546*b*.

Word lines (WLs) 560 can be configured to provide a voltage to a particular memory cell of each of memory strings 520*a*, 520*b* to select which row of bits is to be read, programmed, or erased. Different voltage combinations applied to word lines (WLs) 560 can define read, program (write), and erase operations in the memory cell of memory strings 520*a*, 520*b*, respectively. As shown in FIG. 7, word lines (WLs) 560 can be arranged along the Z-direction (e.g., in cross-sectional view). In some aspects, word lines (WLs)

560 can include a plurality of contacts to memory strings 520*a*, 520*b*. For example, as shown in FIG. 7, word lines (WLs) 560 can include first, second, third, and fourth word line (WL) contacts 560*a*, 560*b*, 560*c*, 560*d*.

In some aspects, coarse TSG 540, buffer TSG 544, and fine TSG 546 are configured to dynamically adjust a threshold voltage ($V_{th}$) of memory strings 520*a*, 520*b* during a programming phase.

Figure 11:
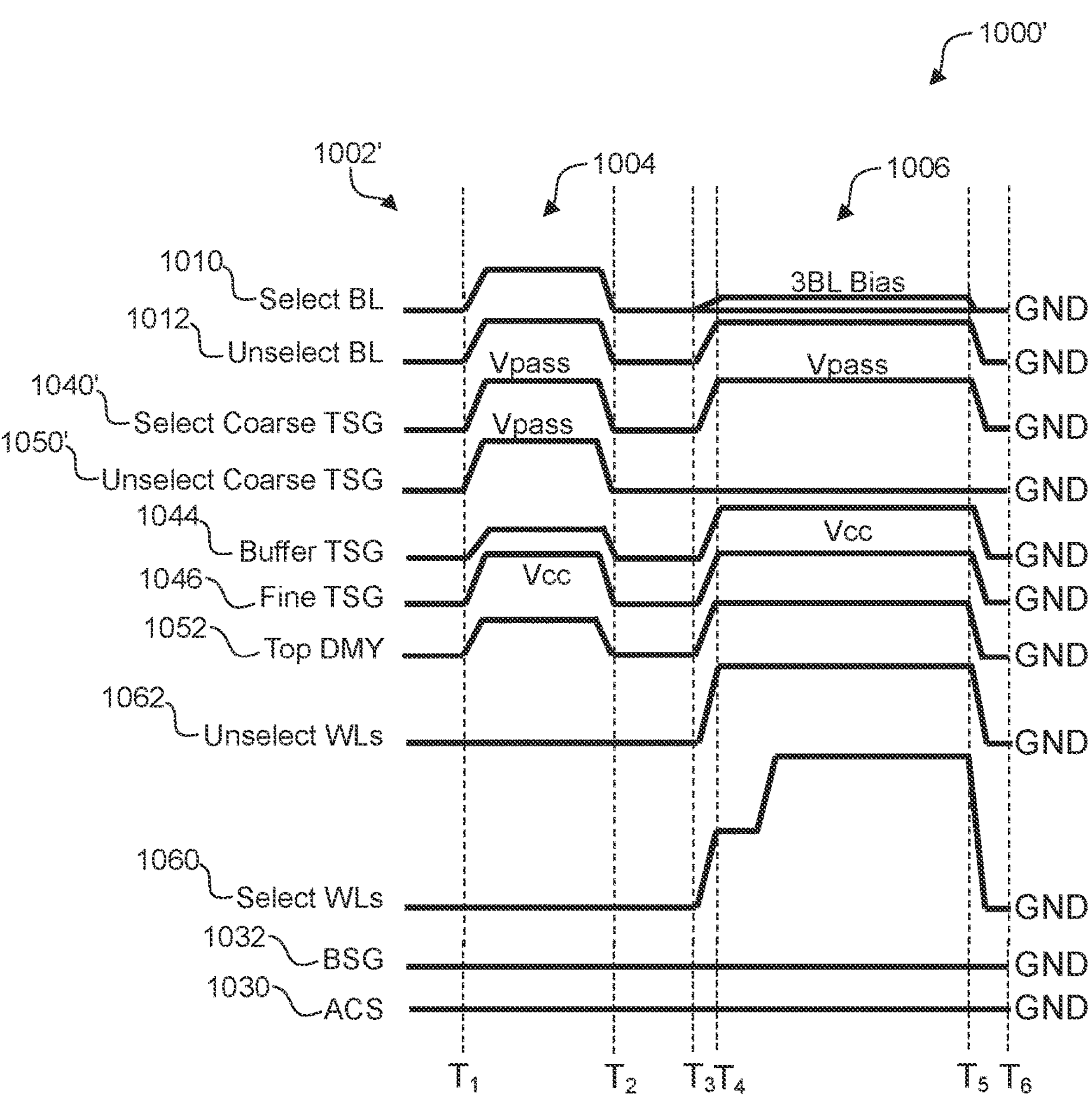
FIG. 11 is a schematic illustration of a select block programming process of the memory devices shown in FIGS. 7 and 9, according to an exemplary aspect.

In some aspects, during a select block programming phase, coarse TSG 540 has a HIGH level voltage, buffer TSG 544 has a HIGH level voltage, and fine TSG 546 has a HIGH level voltage. For example, as shown in FIG. 11, selected coarse TSG 1040' has a HIGH level voltage (e.g., pre-charge $V_{pass}$ voltage), buffer TSG 1044 has a HIGH level voltage (e.g., $V_{cc}$), and fine TSG 1046 has a HIGH level voltage (e.g., $V_{cc}$) for the select block programming phase (e.g., select block programming process 1000').

Figure 13:
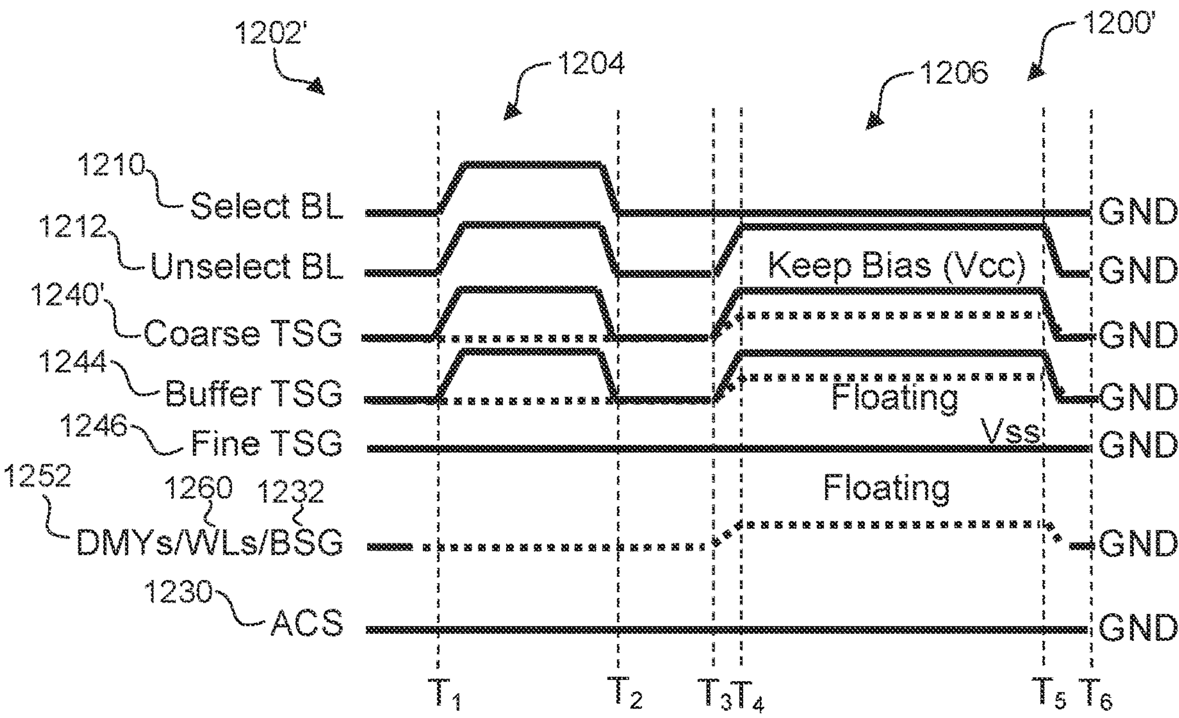
FIG. 13 is a schematic illustration of an unselect block programming process of the memory devices shown in FIGS. 7 and 9, according to an exemplary aspect.

In some aspects, during an unselect block programming phase, coarse TSG 540 has a HIGH level voltage, buffer TSG 544 has a HIGH level voltage, and fine TSG 546 has a LOW level voltage. For example, as shown in FIG. 13, coarse TSG 1240' has a HIGH level voltage (e.g., $V_{cc}$), buffer TSG 1244 has a HIGH level voltage (e.g., $V_{cc}$), and fine TSG 1246 has a LOW level voltage (e.g., $V_{ss}$) for the unselect block programming phase (e.g., unselect block programming process 1200'). For example, as shown in FIG. 13, coarse TSG 1240' has a HIGH level voltage (e.g., floating voltage), buffer TSG 1244 has a HIGH level voltage (e.g., floating voltage), and fine TSG 1246 has a LOW level voltage (e.g., $V_{ss}$) for the unselect block programming phase (e.g., unselect block programming process 1200').

In some aspects, memory controller 106 (shown in FIG. 1) can be coupled to memory device 500', and be configured to apply different voltage combinations to memory device 500'. For example, memory controller 106 can be coupled to bit lines (BL) 510*a*, 510*b*, ACS 530, BSG 532, coarse TSG 540, buffer TSG 544, fine TSG 546, and/or word lines (WLs) 560 of memory device 500', and be configured to provide different voltage combinations to bit lines (BL) 510*a*, 510*b*, ACS 530, BSG 532, coarse TSG 540, buffer TSG 544, fine TSG 546, and/or word lines (WLs) 560.

As shown in FIG. 8, TSG voltage distribution 800 can include count 802, threshold voltage ($V_{th}$) 804, coarse TSG voltage distribution 840, buffer TSG voltage distribution 844, and fine TSG voltage distribution 846. Coarse TSG voltage distribution 840 includes coarse TSG voltage 841 that corresponds to an applied threshold voltage ($V_{th\_coarse}$) of coarse TSG 540 of memory device 500'. Buffer TSG voltage distribution 844 includes buffer TSG voltage 845 that corresponds to an applied threshold voltage ($V_{th\_buffer}$) of buffer TSG 544 of memory device 500'. Fine TSG voltage distribution 846 includes fine TSG voltage 847 that corresponds to an applied threshold voltage ($V_{th\_fine}$) of fine TSG 546 of memory device 500'.

In some aspects, coarse TSG voltage 841 can include a range from about 0.5 V to about 10 V. For example, coarse TSG voltage 841 can include a range from about 2 V to about 5 V. In some aspects, buffer TSG voltage 845 can include a range from about 0 V to about 5 V. For example, buffer TSG voltage 845 can include a range from about 0 V to about 2 V. In some aspects, fine TSG voltage 847 can include a range from about 1 V to about 3 V. For example, fine TSG voltage 847 can include a range from about 2 V to about 2.2 V.

The aspects of memory device 600 shown in FIGS. 6A and 6B and the aspects of memory device 600' shown in FIG. 9 may be similar. Similar reference numbers are used to indicate features of the aspects of memory device 600 shown in FIGS. 6A and 6B and the similar features of the aspects of memory device 600' shown in FIG. 9. In some aspects, as shown in FIG. 9, memory device 600' can include coarse TSG 640, buffer TSG 644, and fine TSG 646, rather than TSG 640 of memory device 600 shown in FIGS. 6A and 6B.

As shown in FIG. 9, memory device 600' can include bit lines (BL) 610*a*, 610*b*, memory strings 620*a*, 620*b*, ACS 630, bottom select gate (BSG) 632, coarse TSG 640, skewed TSG cut 642, buffer TSG 644, fine TSG 646, and word lines (WLs) 660. Memory device 600' can be configured to intrinsically increase a coarse threshold voltage ($V_{th\_coarse}$) (e.g., coarse threshold voltage ($V_{th\_coarse}$) 841 shown in FIG. 8) and decrease leakage current in memory strings 620*a*, 620*b* through doping (e.g., channel doping 680). Memory device 600' can be further configured to provide adjustable TSG control with coarse TSG 640, buffer TSG 644, and fine TSG 646 to dynamically adjust and fine tune a threshold voltage ($V_{th}$) of memory strings 620*a*, 620*b* and increase TSG reliability. Memory device 600' can be further configured to provide reduced critical dimensions (e.g., diameter) of memory strings 620*a*, 620*b* with extended memory strings 621*a*, 621*b* and skewed TSG cut 642 (e.g., zig-zag shape).

Bit lines (BL) 610*a*, 610*b* can be configured to address memory strings 620*a*, 620*b* of memory device 600', respectively. Each bit line (BL) 610*a*, 610*b* can be connected to two or more serially connected memory cells (e.g., in corresponding memory strings 620*a*, 620*b*). Different voltage combinations applied to bit lines (BL) 610*a*, 610*b* can define read, program (write), and erase operations in memory strings 620*a*, 620*b*, respectively. As shown in FIG. 9, bit lines (BL) 610*a*, 610*b* can be connected to an upper portion of memory strings 620*a*, 620*b*, respectively, for example, channel 624*a*, 624*b* of extended memory string 621*a*, 621*b*, respectively. In some aspects, bit lines (BL) 610*a*, 610*b* can each extend along the Y-direction.

Memory strings 620*a*, 620*b* can each be configured to store electrical charge. In some aspects, memory strings 620*a*, 620*b* can each include two or more serially connected memory cells (e.g., memory cells 308 of memory string 310 shown in FIG. 3). In some aspects, memory strings 620*a*, 620*b* can each include a NAND string (e.g., memory string 310 shown in FIG. 3). Memory strings 620*a*, 620*b* can each be similar to memory string 620 shown in FIGS. 6A and 6B. As shown in FIG. 9, memory strings 620*a*, 620*b* can include extended memory strings 621*a*, 621*b*, embedded memory strings 623*a*, 623*b*, body 622*a*, 622*b*, channel 624*a*, 624*b*, first insulating layer 626*a*, 626*b*, charge trap layer 628*a*, 628*b*, and/or second insulating layer 629*a*, 629*b*, respectively. In some aspects, embedded memory strings 623*a*, 623*b* can be similar to embedded memory string 623 shown in FIGS. 6A and 6B.

As shown in FIG. 9, memory strings 620*a*, 620*b* can each include extended memory strings 621*a*, 621*b* and embedded memory strings 623*a*, 623*b*, respectively. In some aspects, as shown in FIG. 9, extended memory strings 621*a*, 621*b* can be disposed atop embedded memory strings 623*a*, 623*b*, respectively. In some aspects, as shown in FIG. 9, extended memory strings 621*a*, 621*b* can have a smaller critical dimension (e.g., diameter) than embedded memory strings 623*a*, 623*b*. In some aspects, extended memory strings 621*a*, 621*b* can extend through coarse TSG 640.

In some aspects, embedded memory strings 623*a*, 623*b* can be similar to embedded memory string 623 shown in FIGS. 6A and 6B. In some aspects, embedded memory strings 623*a*, 623*b* can include body 622*a*, 622*b*, channel 624*a*, 624*b*, first insulating layer 626*a*, 626*b*, charge trap layer 628*a*, 628*b*, and/or second insulating layer 629*a*, 629*b*, respectively. In some aspects, as shown in FIG. 9, embedded memory strings 623*a*, 623*b* can be disposed below and isolated from coarse TSG 640. In some aspects, as shown in FIG. 9, embedded memory strings 623*a*, 623*b* can contact word lines (WLs) 660.

In some aspects, extended memory strings 621*a*, 621*b* can include the same materials as embedded memory strings 623*a*, 623*b*. In some aspects, extended memory strings 621*a*, 621*b* can each omit one or more materials of embedded memory strings 623*a*, 623*b*. For example, extended memory strings 621*a*, 621*b* can omit first insulating layer 626*a*, 626*b* and/or charge trap layer 628*a*, 628*b* of embedded memory strings 623*a*, 623*b*, respectively, to increase manufacturing efficiency and improve memory density. In some aspects, as shown in FIG. 9, extended memory strings 621*a*, 621*b* can include extended body 612*a*, 612*b*, extended channel 614*a*, 614*b*, and extended insulating layer 616*a*, 616*b*. In some aspects, extended memory strings 621*a*, 621*b* can include body 622*a*, 622*b*, channel 624*a*, 624*b*, and/or second insulating layer 629*a*, 629*b* of embedded memory string 623, respectively.

In some aspects, a portion of memory strings 620*a*, 620*a* can each be doped. For example, as shown in FIG. 9, an extended channel region of extended memory strings 621*a*, 621*b* can each include channel doping 680. In some aspects, channel doping 680 can include p-type doping of channel 624*a*, 624*b* in extended memory strings 621*a*, 621*b*, respectively. In some aspects, channel doping 680 can extend along channel 624*a*, 624*b* adjacent coarse TSG 640 (e.g., first and second coarse TSG contacts 640*a*, 640*b*). In some aspects, channel doping 680 can be configured to intrinsically adjust (e.g., increase) a coarse threshold voltage ($V_{th\_coarse}$) (e.g., coarse threshold voltage ($V_{th\_coarse}$) 841 shown in FIG. 8). For example, channel doping 680 can adjust the coarse threshold voltage ($V_{th\_coarse}$) in a range from about 2 V to about 5 V. For example, channel doping 680 can adjust the coarse threshold voltage ($V_{th\_coarse}$) in a range from about 0 V to about 10 V. In some aspects, channel doping 680 can be configured to decrease leakage current in memory strings 620*a*, 620*b*. For example, leakage current can be decreased between bit lines (BL) 610*a*, 610*b* and coarse TSG 640 due to channel doping 680.

ACS 630 can be configured to address memory strings 620*a*, 620*b* of memory device 600'. ACS 630 can include ACS contact 630*a* connected to two or more serially connected memory cells (e.g., memory strings 620*a*, 620*b*). Different voltage combinations applied to ACS 630 can define read, program (write), and erase operations in memory strings 620*a*, 620*b*. In some aspects, as shown in FIG. 9, ACS contact 630*a* can contact a lower portion of memory strings 620*a*, 620*b* and extend along the X-direction and the Y-direction.

BSG 632 can be configured to address memory strings 620*a*, 620*b* of memory device 600'. BSG 632 can include BSG contact 632*a* connected to two or more serially connected memory cells (e.g., memory strings 620*a*, 620*b*). In some aspects, as shown in FIG. 9, BSG contact 632*a* can contact a lower portion of memory strings 620*a*, 620*b* and extend along the X-direction and the Y-direction.

Coarse TSG 640 can be configured to provide a coarse voltage (e.g., threshold voltage ($V_{th}$)) to memory strings 620*a*, 620*b* to select which row of bits is to be read, programmed, or erased. Coarse TSG 640 can be configured to address memory strings 620*a*, 620*b*. Coarse TSG 640 can be further configured to provide a coarse threshold voltage ($V_{th\_coarse}$) (e.g., coarse TSG voltage 841 shown in FIG. 8) for programming memory strings 620*a*, 620*b*. In some aspects, the coarse threshold voltage ($V_{th\_coarse}$) (e.g., coarse TSG voltage 841 shown in FIG. 8) can include a range from about 2 V to about 5 V. In some aspects, the coarse threshold voltage ($V_{th\_coarse}$) (e.g., coarse TSG voltage 841 shown in FIG. 8) can include a range from about 0 V to about 10 V. Coarse TSG 640 can be further configured to provide dynamic adjustment and fine tuning of a threshold voltage ($V_{th}$) of memory strings 620*a*, 620*b* and increase TSG reliability.

As shown in FIG. 9, coarse TSG 640 can contact extended memory strings 621*a*, 621*b* and extend along the X-direction and the Y-direction. In some aspects, coarse TSG 640 can include a plurality of contacts to extended memory strings 621*a*, 621*b*. For example, as shown in FIG. 9, coarse TSG 640 can include first and second coarse TSG contacts 640*a*, 640*b*. In some aspects, as shown in FIG. 9, coarse TSG 640 can be divided (e.g., cut through) by skewed TSG cut 642.

Skewed TSG cut 642 can be configured to divide and separate memory pages (e.g., memory pages 650*a*-650*d* shown in FIG. 6A) from each other. As shown in FIG. 9, skewed TSG cut 642 can extend along the X-direction between extended memory strings 621*a*, 621*b* (e.g., between memory pages 650*a*, 650*b* shown in FIG. 6A). In some aspects, skewed TSG cut 642 can include a zig-zag shape, for example, along the X-direction between adjacent memory strings 620*a*, 620*b*. In some aspects, as shown in FIG. 9, skewed TSG cut 642 can extend only through coarse TSG 640 and not into buffer TSG 644 disposed below coarse TSG 640.

Buffer TSG 644 can be configured to provide a buffer voltage (e.g., threshold voltage ($V_{th}$)) to memory strings 620*a*, 620*b* to select which row of bits is to be read, programmed, or erased. Buffer TSG 644 can be configured to address memory strings 620*a*, 620*b*. Buffer TSG 644 can be further configured to provide a buffer threshold voltage ($V_{th\_buffer}$) (e.g., buffer TSG voltage 845 shown in FIG. 8) for programming memory strings 620*a*, 620*b*. Buffer TSG 644 can be further configured to provide a buffer or isolation between coarse TSG 640 and fine TSG 646. In some aspects, the buffer threshold voltage ($V_{th\_buffer}$) (e.g., buffer TSG voltage 845 shown in FIG. 8) can include a range from about 0 V to about 2 V. In some aspects, the buffer threshold voltage ($V_{th\_buffer}$) (e.g., buffer TSG voltage 845 shown in FIG. 8) can include a range from about 0 V to about 5 V. Buffer TSG 644 can be further configured to provide dynamic adjustment and fine tuning of a threshold voltage ($V_{th}$) of memory strings 620*a*, 620*b* and increase TSG reliability.

As shown in FIG. 9, buffer TSG 644 can contact an upper portion of embedded memory strings 623*a*, 623*b* and extend along the X-direction and the Y-direction. In some aspects, as shown in FIG. 9, buffer TSG 644 can be disposed below coarse TSG 640. In some aspects, buffer TSG 644 can include a plurality of contacts to embedded memory strings 623*a*, 623*b*. For example, as shown in FIG. 9, buffer TSG 644 can include first and second buffer TSG contacts 644*a*, 644*b*.

Fine TSG 646 can be configured to provide a fine voltage (e.g., threshold voltage ($V_{th}$)) to embedded memory strings 623*a*, 623*b* to select which row of bits is to be read, programmed, or erased. Fine TSG 646 can be configured to address memory strings 620*a*, 620*b*. Fine TSG 646 can be further configured to provide a fine threshold voltage ($V_{th\_fine}$) (e.g., fine TSG voltage 847 shown in FIG. 8) for programming memory strings 620*a*, 620*b*. Fine TSG 646 can be further configured to provide fine adjustment of the coarse voltage of coarse TSG 640. In some aspects, the fine threshold voltage ($V_{th\_fine}$) (e.g., fine TSG voltage 847 shown in FIG. 8) can include a range from about 2 V to about 2.2 V. In some aspects, the fine threshold voltage ($V_{th\_fine}$) (e.g., fine TSG voltage 847 shown in FIG. 8) can include a range from about 1 V to about 3 V. Fine TSG 646 can be further configured to provide dynamic adjustment and fine tuning of a threshold voltage ($V_{th}$) of memory strings 620*a*, 620*b* and increase TSG reliability.

As shown in FIG. 9, fine TSG 646 can contact an upper portion of embedded memory strings 623*a*, 623*b* and extend along the X-direction and the Y-direction. In some aspects, as shown in FIG. 9, fine TSG 646 can be disposed below buffer TSG 644. In some aspects, as shown in FIG. 9, buffer TSG 644 can be arranged atop fine TSG 646, and coarse TSG 640 can be arranged atop buffer TSG 644. In some aspects, fine TSG 646 can include a plurality of contacts to embedded memory strings 623*a*, 623*b*. For example, as shown in FIG. 9, fine TSG 646 can include first and second fine TSG contacts 646*a*, 646*b*.

Word lines (WLs) 660 can be configured to provide a voltage to a particular memory cell of each of memory strings 620*a*, 620*b* to select which row of bits is to be read, programmed, or erased. Different voltage combinations applied to word lines (WLs) 660 can define read, program (write), and erase operations in the memory cell of memory strings 620*a*, 620*b*, respectively. As shown in FIG. 9, word lines (WLs) 660 can be arranged along the Z-direction (e.g., in cross-sectional view). In some aspects, word lines (WLs) 660 can include a plurality of contacts to embedded memory strings 623*a*, 623*b*. For example, as shown in FIG. 9, word lines (WLs) 660 can include first, second, third, and fourth word line (WL) contacts 660*a*, 660*b*, 660*c*, 660*d*.

In some aspects, coarse TSG 640, buffer TSG 644, and fine TSG 646 are configured to dynamically adjust a threshold voltage ($V_{th}$) of memory strings 620*a*, 620*b* during a programming phase.

In some aspects, during a select block programming phase, coarse TSG 640 has a HIGH level voltage, buffer TSG 644 has a HIGH level voltage, and fine TSG 646 has a HIGH level voltage. For example, as shown in FIG. 11, selected coarse TSG 1040' has a HIGH level voltage (e.g., pre-charge $V_{pass}$ voltage), buffer TSG 1044 has a HIGH level voltage (e.g., $V_{cc}$), and fine TSG 1046 has a HIGH level voltage (e.g., $V_{cc}$) for the select block programming phase (e.g., select block programming process 1000').

In some aspects, during an unselect block programming phase, coarse TSG 640 has a HIGH level voltage, buffer TSG 644 has a HIGH level voltage, and fine TSG 646 has a LOW level voltage. For example, as shown in FIG. 13, coarse TSG 1240' has a HIGH level voltage (e.g., $V_{cc}$), buffer TSG 1244 has a HIGH level voltage (e.g., $V_{cc}$), and fine TSG 1246 has a LOW level voltage (e.g., $V_{ss}$) for the unselect block programming phase (e.g., unselect block programming process 1200'). For example, as shown in FIG. 13, coarse TSG 1240' has a HIGH level voltage (e.g., floating voltage), buffer TSG 1244 has a HIGH level voltage (e.g., floating voltage), and fine TSG 1246 has a LOW level voltage (e.g., $V_{ss}$) for the unselect block programming phase (e.g., unselect block programming process 1200').

Similar to memory device 500', TSG voltage distribution 800 shown in FIG. 8 can correspond to applied threshold voltages ($V_{th}$) of coarse TSG 640, buffer TSG 644, and fine TSG 646 of memory device 600', respectively. For example, coarse TSG voltage distribution 840 includes coarse TSG voltage 841 that corresponds to an applied threshold voltage ($V_{th\_coarse}$) of coarse TSG 640 of memory device 600'. For example, buffer TSG voltage distribution 844 includes buffer TSG voltage 845 that corresponds to an applied threshold voltage ($V_{th\_buffer}$) of buffer TSG 644 of memory device 600'. For example, fine TSG voltage distribution 846 includes fine TSG voltage 847 that corresponds to an applied threshold voltage ($V_{th\_fine}$) of fine TSG 646 of memory device 600'.

In some aspects, memory controller 106 (shown in FIG. 1) can be coupled to memory device 600', and be configured to apply different voltage combinations to memory device 600'. For example, memory controller 106 can be coupled to bit lines (BL) 610*a*, 610*b*, ACS 630, BSG 632, coarse TSG 640, buffer TSG 644, fine TSG 646, and/or word lines (WLs) 660 of memory device 600', and be configured to provide different voltage combinations to bit lines (BL) 610*a*, 610*b*, ACS 630, BSG 632, coarse TSG 640, buffer TSG 644, fine TSG 646, and/or word lines (WLs) 660.

Exemplary Programming Processes

Figure 10:
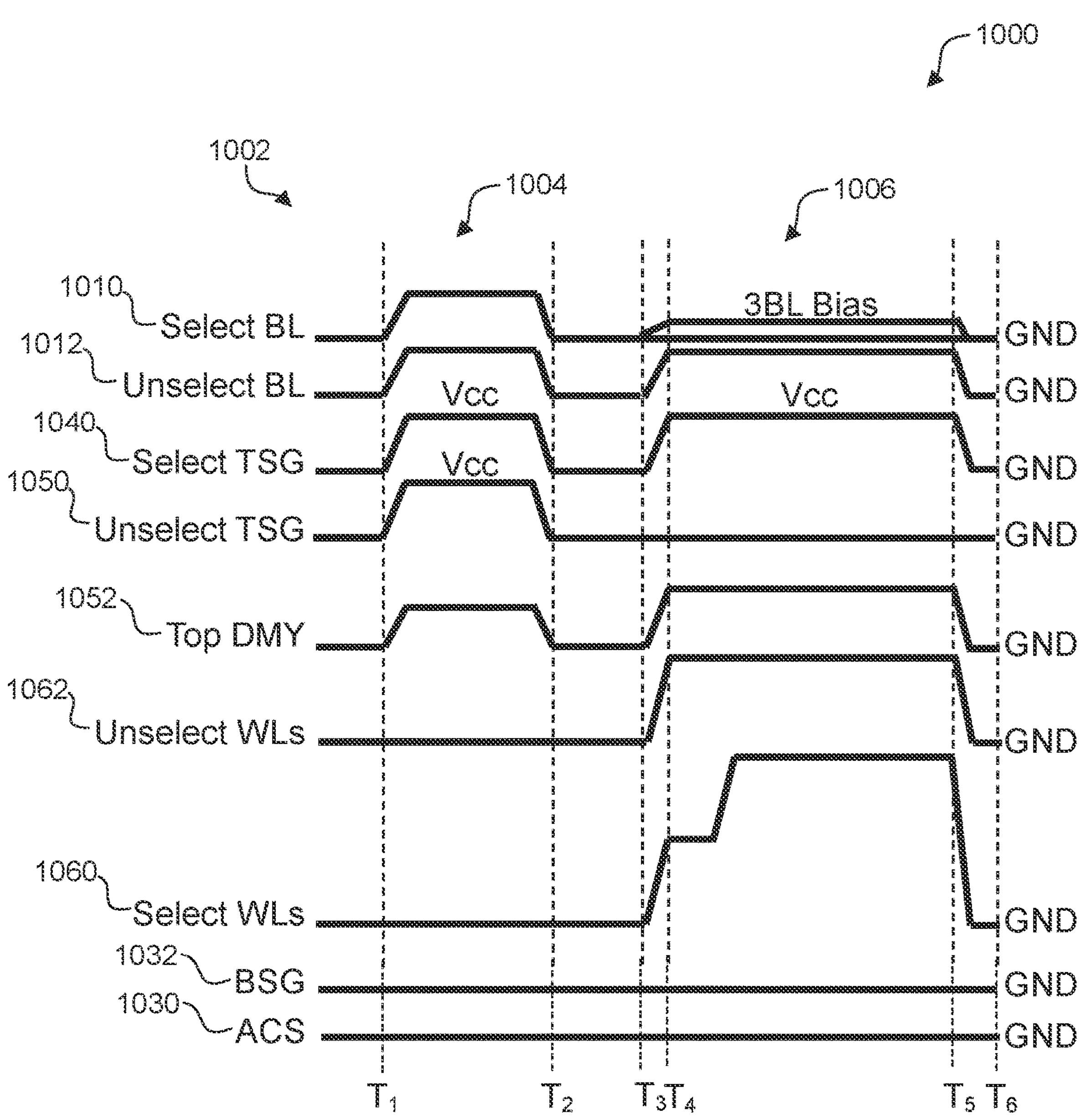
FIG. 10 is a schematic illustration of a select block programming process, according to an exemplary aspect.
Figure 12:
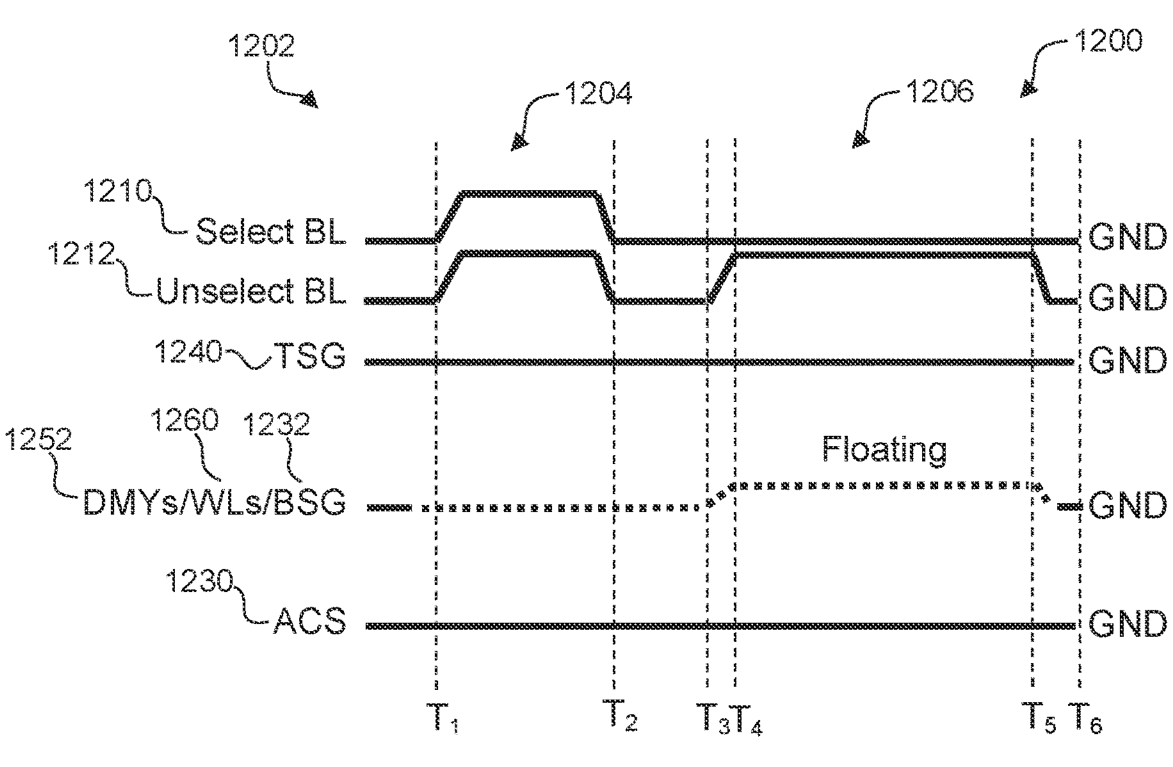
FIG. 12 is a schematic illustration of an unselect block programming process, according to an exemplary aspect.

FIGS. 10-13 illustrate programming processes 1000, 1000', 1200, 1200', according to various exemplary aspects. FIG. 10 is a schematic illustration of select block programming process 1000, according to an exemplary aspect. FIG. 11 is a schematic illustration of select block programming process 1000' of memory devices 500', 600' shown in FIGS. 7 and 9, according to an exemplary aspect. FIG. 12 is a schematic illustration of unselect block programming process 1200, according to an exemplary aspect. FIG. 13 is a schematic illustration of unselect block programming process 1200' of memory devices 500', 600' shown in FIGS. 7 and 9, according to an exemplary aspect.

Although programming processes 1000, 1000', 1200, 1200' are shown in FIGS. 10-13 as stand-alone apparatuses, systems, and/or methods, the aspects of these disclosures can be used with other apparatuses, systems, and/or methods, such as, but not limited to, memory apparatus 102, memory controller 106, memory system 100, memory device 400, memory device 500, memory device 600, memory device 500', TSG voltage distribution 800, and/or memory device 600'.

As shown in FIG. 10, select block programming process 1000 can include voltage distribution 1002, verify phase 1004, and program phase 1006. Select block programming process 1000 can be configured to select a memory block or a memory page of a memory device during programming, for example, memory devices 500, 600 shown in FIGS. 5A, 5B, 6A, and 6B, respectively. Voltage distribution 1002 can include selected bit line (BL) 1010, unselected bit line (BL) 1012, ACS 1030, BSG 1032, selected TSG 1040, unselected TSG 1050, top dummy (DMY) layer 1052, selected word lines (WLs) 1060, and/or unselected word lines (WLs) 1062.

During verify phase 1004 from the periods $T_1$-$T_2$, selected bit line (BL) 1010, unselected bit line (BL) 1012, selected TSG 1040, unselected TSG 1050, and top dummy (DMY) layer 1052 can be biased to a HIGH level voltage (e.g., $V_{cc}$), and ACS 1030, BSG 1032, selected word lines (WLs) 1060, and unselected word lines (WLs) 1062 can be biased to a LOW level voltage (e.g., ground level GND).

During program phase 1006 from the periods $T_3$-$T_6$, selected bit line (BL) 1010 can be biased to a HIGH level voltage (e.g., three BL bias), unselected bit line (BL) 1012, selected TSG 1040, top dummy (DMY) layer 1052, selected word lines (WLs) 1060, and unselected word lines (WLs) 1062 can be biased to a HIGH level voltage (e.g., $V_{cc}$), and ACS 1030, BSG 1032, and unselected TSG 1050 can be biased to a LOW level voltage (e.g., ground level GND).

In some aspects, select block programming process 1000 can be utilized to program memory device 500 shown in FIG. 5A (e.g., memory page 550_a_). In some aspects, select block programming process 1000 can be utilized to program memory device 600 shown in FIG. 6A (e.g., memory page 650_a_).

The aspects of select block programming process 1000 shown in FIG. 10 and the aspects of select block programming process 1000' shown in FIG. 11 may be similar. Similar reference numbers are used to indicate features of the aspects of select block programming process 1000 shown in FIG. 10 and the similar features of the aspects of select block programming process 1000' shown in FIG. 11. In some aspects, as shown in FIG. 11, select block programming process 1000' can include selected coarse TSG 1040', unselected coarse TSG 1050', buffer TSG 1044, and fine TSG 1046, rather than selected TSG 1040 and unselected TSG 1050 of select block programming process 1000 shown in FIG. 10.

As shown in FIG. 11, select block programming process 1000' can include voltage distribution 1002', verify phase 1004, and program phase 1006. Select block programming process 1000' can be configured to select a memory block or a memory page of a memory device for programming, for example, memory devices 500', 600' shown in FIGS. 7 and 9, respectively. Voltage distribution 1002' can include selected bit line (BL) 1010, unselected bit line (BL) 1012, ACS 1030, BSG 1032, selected coarse TSG 1040', buffer TSG 1044, fine TSG 1046, unselected coarse TSG 1050', top dummy (DMY) layer 1052, selected word lines (WLs) 1060, and/or unselected word lines (WLs) 1062.

During verify phase 1004 from the periods $T_1$-$T_2$, selected bit line (BL) 1010, unselected bit line (BL) 1012, selected coarse TSG 1040', buffer TSG 1044, fine TSG 1046, unselected coarse TSG 1050', and top dummy (DMY) layer 1052 can be biased to a HIGH level voltage (e.g., $V_{cc}$ or $V_{pass}$), and ACS 1030, BSG 1032, selected word lines (WLs) 1060, and unselected word lines (WLs) 1062 can be biased to a LOW level voltage (e.g., ground level GND).

During program phase 1006 from the periods $T_3$-$T_6$, selected bit line (BL) 1010 can be biased to a HIGH level voltage (e.g., three BL bias), unselected bit line (BL) 1012, selected coarse TSG 1040', buffer TSG 1044, fine TSG 1046, top dummy (DMY) layer 1052, selected word lines (WLs) 1060, and unselected word lines (WLs) 1062 can be biased to a HIGH level voltage (e.g., $V_{cc}$ or $V_{pass}$), and ACS 1030, BSG 1032, and unselected coarse TSG 1050' can be biased to a LOW level voltage (e.g., ground level GND).

In some aspects, select block programming process 1000' can be utilized to program memory device 500' shown in FIG. 7 (e.g., memory strings 520_a_, 520_b_). In some aspects, select block programming process 1000' can be utilized to program memory device 600' shown in FIG. 9 (e.g., memory strings 620_a_, 620_b_).

As shown in FIG. 12, unselect block programming process 1200 can include voltage distribution 1202, verify phase 1204, and program phase 1206. Unselect block programming process 1200 can be configured to unselect a memory block or a memory page of a memory device during programming, for example, memory devices 500, 600 shown in FIGS. 5A, 5B, 6A, and 6B, respectively. Voltage distribution 1202 can include selected bit line (BL) 1210, unselected bit line (BL) 1212, ACS 1230, TSG 1240, dummy (DMY) layers 1252, word lines (WLs) 1260, and/or BSG 1232.

During verify phase 1204 from the periods $T_1$-$T_2$, selected bit line (BL) 1210 and unselected bit line (BL) 1212 can be biased to a HIGH level voltage (e.g., $V_{cc}$), and ACS 1230, BSG 1232, TSG 1240, dummy (DMY) layers 1252, and word lines (WLs) 1260 can be biased to a LOW level voltage (e.g., ground level GND).

During program phase 1206 from the periods $T_3$-$T_6$, unselected bit line (BL) 1212 can be biased to a HIGH level voltage (e.g., $V_{cc}$), BSG 1232, dummy (DMY) layers 1252, and word lines (WLs) 1260 can be biased to a HIGH level voltage (e.g., floating voltage), and selected bit line (BL) 1210, ACS 1230, and TSG 1240 can be biased to a LOW level voltage (e.g., ground level GND).

In some aspects, unselect block programming process 1200 can include unselecting memory device 500 shown in FIG. 5A (e.g., memory page 550_a_). In some aspects, unselect block programming process 1200 can include unselecting memory device 600 shown in FIG. 6A (e.g., memory page 650_a_).

The aspects of unselect block programming process 1200 shown in FIG. 12 and the aspects of unselect block programming process 1200' shown in FIG. 13 may be similar. Similar reference numbers are used to indicate features of the aspects of unselect block programming process 1200 shown in FIG. 12 and the similar features of the aspects of unselect block programming process 1200' shown in FIG. 13. In some aspects, as shown in FIG. 13, unselect block programming process 1200' can include coarse TSG 1240', buffer TSG 1244, and fine TSG 1246, rather than TSG 1240 of unselect block programming process 1200 shown in FIG. 12.

As shown in FIG. 13, unselect block programming process 1200' can include voltage distribution 1202', verify phase 1204, and program phase 1206. Unselect block programming process 1200' can be configured to unselect a memory block or a memory page of a memory device during programming, for example, memory devices 500', 600' shown in FIGS. 7 and 9, respectively. Voltage distribution 1202' can include selected bit line (BL) 1210, unselected bit line (BL) 1212, ACS 1230, coarse TSG 1240', buffer TSG 1244, fine TSG 1246, dummy (DMY) layers 1252, word lines (WLs) 1260, and/or BSG 1232.

During verify phase 1204 from the periods $T_1$-$T_2$, selected bit line (BL) 1210 unselected bit line (BL) 1212, coarse TSG 1240', and buffer TSG 1244 can be biased to a HIGH level voltage (e.g., $V_{cc}$), and ACS 1230, BSG 1232, fine TSG 1246, dummy (DMY) layers 1252, and word lines (WLs) 1260 can be biased to a LOW level voltage (e.g., ground level GND). In some aspects, as shown in FIG. 13, coarse TSG 1240' and buffer TSG 1244 can be biased to a LOW level voltage (e.g., floating voltage or ground level GND).

During program phase 1206 from the periods $T_3$-$T_6$, unselected bit line (BL) 1212, coarse TSG 1240', and buffer TSG 1244 can be biased to a HIGH level voltage (e.g., $V_{cc}$ or floating voltage), BSG 1232, dummy (DMY) layers 1252, and word lines (WLs) 1260 can be biased to a HIGH level voltage (e.g., floating voltage), and selected bit line (BL) 1210, ACS 1230, and fine TSG 1246 can be biased to a LOW level voltage (e.g., $V_{SS}$ or ground level GND). In some aspects, as shown in FIG. 13, coarse TSG 1240' and buffer TSG 1244 can be biased to a floating voltage.

In some aspects, select block programming process 1200' can include unselecting memory device 500' shown in FIG. 7 (e.g., memory strings 520_a_, 520_b_). In some aspects, unselect block programming process 1200' can include unselecting memory device 600' shown in FIG. 9 (e.g., memory strings 620_a_, 620_b_).

It is to be understood that the phraseology or terminology herein is for the purpose of description and not of limitation, such that the terminology or phraseology of the present specification is to be interpreted by those skilled in relevant art(s) in light of the teachings herein.

The following examples are illustrative, but not limiting, of the aspects of this disclosure. Other suitable modifications and adaptations of the variety of conditions and parameters normally encountered in the field, and which would be apparent to those skilled in the relevant art(s), are within the spirit and scope of the disclosure.

While specific aspects have been described above, it will be appreciated that the aspects may be practiced otherwise than as described. The description is not intended to limit the scope of the claims.

It is to be appreciated that the Detailed Description section, and not the Summary and Abstract sections, is intended to be used to interpret the claims. The Summary and Abstract sections may set forth one or more but not all exemplary aspects as contemplated by the inventor(s), and thus, are not intended to limit the aspects and the appended claims in any way.

The aspects have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects will so fully reveal the general nature of the aspects that others can, by applying knowledge within the skill of the art, readily modify and/or adapt for various applications such specific aspects, without undue experimentation, without departing from the general concept of the aspects. Therefore, such adaptations and modifications are intended to be within the meaning and range of equivalents of the disclosed aspects, based on the teaching and guidance presented herein.

The breadth and scope of the aspects should not be limited by any of the above-described exemplary aspects, but should be defined only in accordance with the following claims and their equivalents.

What is claimed is:

1. A three-dimensional memory device comprising:

a memory string; a first gate contact surrounding a first portion of the memory string, the first gate contact coupled to a coarse top select gate (TSG) line configured to couple a coarse threshold voltage (V.sub.th_coarse) for programming the memory string, wherein the first portion of the memory string is doped to increase the coarse threshold voltage and decrease leakage current of the memory string;

a second gate contact surrounding a second portion of the memory string, the second gate contact coupled to a word line configured to program the memory string; and a coarse TSG cut extending into a portion of the memory string and disposed between the memory string and a second memory string adjacent the memory string.

2. The memory device of claim 1, wherein the first gate contact comprises a plurality of first gate contacts each coupled to the coarse TSG line.

3. The memory device of claim 1, wherein the coarse TSG cut extends into a channel of the memory string and a channel of the second memory string.

4. The memory device of claim 1, wherein the coarse TSG cut extends into a channel of the memory string or a channel of the second memory string.

5. The memory device of claim 1, further comprising a third gate contact surrounding a third portion of the memory string, the third gate contact coupled to a buffer TSG line configured to couple a buffer threshold voltage (V.sub.th_buffer) for programming the memory string.

6. The memory device of claim 1, further comprising a fourth gate contact surrounding a fourth portion of the memory string, the fourth gate contact coupled to a fine TSG line configured to couple a fine threshold voltage (V.sub.th_fine) for programming the memory string.

7. A three-dimensional memory device comprising:

a memory string;

a first gate contact surrounding a first portion of the memory string, the first gate contact coupled to a coarse top select gate (TSG) line configured to couple a coarse threshold voltage (V.sub.th_coarse) for programming the memory string;

a second gate contact surrounding a second portion of the memory string, the second gate contact coupled to a word line configured to program the memory string;

a third gate contact surrounding a third portion of the memory string, the third gate contact coupled to a buffer TSG line configured to couple a buffer threshold voltage (V.sub.th_buffer) for programming the memory string;

a fourth gate contact surrounding a fourth portion of the memory string, the fourth gate contact coupled to a fine TSG line configured to couple a fine threshold voltage (V.sub.th_fine) for programming the memory string; and a coarse TSG cut disposed between the memory string and a second memory string adjacent the memory string, wherein the coarse TSG cut comprises a skewed TSG cut having a zig-zag shape in plan view.

8. The memory device of claim 7, wherein the buffer TSG line is arranged atop the fine TSG line and the coarse TSG line is arranged atop the buffer TSG line.

9. The memory device of claim 7, further comprising:

a top contact coupled to the memory string, the top contact coupled to a bit line configured to flow electrical charge through the memory string; and a bottom contact coupled to the memory string, the bottom contact coupled to a source line configured to flow electrical charge through the memory string.

10. The memory device of claim 8, further comprising a fifth gate contact surrounding a fifth portion of the memory string, the fifth gate contact coupled to a bottom select gate (BSG) line.

11. The memory device of claim 7, wherein the first portion of the memory string is doped.

12. The memory device of claim 7, further comprising a controller coupled to the coarse TSG line, the buffer TSG line, and the fine TSG line, the controller configured to provide the coarse threshold voltage (V.sub.th_coarse), the buffer threshold voltage (V.sub.th_buffer), and fine threshold voltage (V.sub.th_fine) to dynamically adjust a threshold voltage (V.sub.th) of the memory string during a programming phase of the memory string.

13. The memory device of claim 7, wherein, in a select block programming phase, the coarse TSG line has a HIGH level voltage, the buffer TSG line has a HIGH level voltage, and the fine TSG line has a HIGH level voltage.

14. The memory device of claim 7, wherein, in an unselect block programming phase, the coarse TSG line has a HIGH level voltage, the buffer TSG line has a HIGH level voltage, and the fine TSG line has a LOW level voltage.

15. A method of programming a memory device, the memory device comprising a plurality of memory strings, each memory string comprising a first transistor controlled by a coarse top select gate (TSG) and connected to a bit line (BL), a second transistor controlled by a buffer TSG, a third transistor controlled by a fine TSG, a bottom transistor controlled by a bottom select gate (BSG), and a plurality of memory cells between the third transistor and the bottom transistor, each memory cell connected to a word line (WL), wherein a skewed TSG cut extends through a coarse TSG of the memory device without extending into a buffer TSG disposed below the coarse TSG in the memory device, the method comprising:

applying a plurality of program pulses to a memory string of the memory device to dynamically adjust a threshold voltage (V.sub.th) of the memory string during a programming phase, wherein applying the plurality of program pulses comprises applying:

a first voltage pulse to a selected coarse TSG to provide a coarse threshold voltage (V.sub.th_coarse);

a second voltage pulse to a buffer TSG to provide a buffer threshold voltage (V.sub.th_buffer); and a third voltage pulse to a fine TSG to provide a fine threshold voltage (V.sub.th_fine).

16. The method of claim 15, wherein, during a select block programming phase:

the first voltage pulse is weighted to a HIGH level voltage of the selected coarse TSG;

the second voltage pulse is weighted to a HIGH level voltage of the buffer TSG; and the third voltage pulse is weighted to a HIGH level voltage of the fine TSG.

17. The method of claim 15, wherein, during a select block programming phase:

the first voltage pulse is weighted to a first pass voltage V.sub.PASS of the selected coarse TSG;

the second voltage pulse is weighted to a first common collector voltage V.sub.CC of the buffer TSG; and the third voltage pulse is weighted to a second common collector voltage V.sub.CC voltage of the fine TSG.

18. The method of claim 15, wherein, during an unselect block programming phase:

the first voltage pulse is weighted to a HIGH level voltage of the selected coarse TSG;

the second voltage pulse is weighted to a HIGH level voltage of the buffer TSG; and the third voltage pulse is weighted to a LOW level voltage of the fine TSG.

19. The method of claim 15, wherein, during an unselect block programming phase:

the first voltage pulse is weighted to a third common collector voltage V.sub.CC of the selected coarse TSG;

the second voltage pulse is weighted to a fourth common collector voltage V.sub.CC of the buffer TSG; and the third voltage pulse is weighted to a first source supply voltage V.sub.SS of the fine TSG.

20. The memory device of claim 7, wherein the skewed TSG cut extends through a coarse TSG of the memory device without extending into a buffer TSG disposed below the coarse TSG in the memory device.

* * * * *